(12) United States Patent
Yamamoto (10) Patent No.: US 7,790,301 B2
(45) Date of Patent: Sep. 7, 2010

(54) HARD COATING, TARGET FOR FORMING HARD COATING, AND METHOD FOR FORMING HARD COATING

(75) Inventor: Kenji Yamamoto, Kobe (JP)

(73) Assignee: Kobe Steel, Ltd., Kobe-shi (JP)

( * ) Notice: Subject to any disclaimer, the term of this patent is extended or adjusted under 35 U.S.C. 154(b) by 109 days.

(21) Appl. No.: 12/262,390

(22) Filed: Oct. 31, 2008

(65) Prior Publication Data

US 2010/0038232 A1  Feb. 18, 2010

Related U.S. Application Data

(62) Division of application No. 11/333,434, filed on Jan. 18, 2006, now Pat. No. 7,479,331.

(30) Foreign Application Priority Data

Feb. 8, 2005 (JP) ............... 2005-032199
Oct. 25, 2005 (JP) ............... 2005-310339

(51) Int. Cl.
*B32B 9/00* (2006.01)

(52) U.S. Cl. ............ 428/697; 428/698; 428/699; 204/192.1

(58) Field of Classification Search ............ 204/192.1; 428/697, 698, 699
See application file for complete search history.

(56) References Cited

U.S. PATENT DOCUMENTS

| 4,714,660 | A | 12/1987 | Gates, Jr. |
| 6,767,658 | B2 | 7/2004 | Yamamoto et al. |
| 6,824,601 | B2 | 11/2004 | Yamamoto et al. |
| 2003/0148145 | A1 | 8/2003 | Yamamoto et al. |
| 2006/0154108 | A1 | 7/2006 | Fukui et al. |

FOREIGN PATENT DOCUMENTS

| JP | 06-322517 | 11/1994 |
| JP | 9-41127 | 2/1997 |
| JP | 11-36063 | 2/1999 |
| JP | 2000-144376 | 5/2000 |
| JP | 2003-34858 | 2/2003 |
| JP | 2003-71610 | 3/2003 |
| JP | 2005-271106 | 10/2005 |
| WO | WO 2005/053887 A1 | 6/2005 |

*Primary Examiner*—Archene Turner
(74) *Attorney, Agent, or Firm*—Oblon, Spivak, McClelland, Maier & Neustadt, L.L.P.

(57) ABSTRACT

The present invention attempts to provide a hard coating which has excellent hardness and lubricity. Such attempt has been completed by providing a hard coating comprising $(Al_{1-a}V_a)(C_{1-x}N_x)$ wherein

$0.27 \leq a \leq 0.75$, and $0.3 \leq X \leq 1$, wherein a and X independently represent an atomic ratio.

16 Claims, 3 Drawing Sheets

HARD COATING, TARGET FOR FORMING HARD COATING, AND METHOD FOR FORMING HARD COATING

FIELD OF THE INVENTION

This invention relates to a hard coating used in cutting tools such as chip, drill, and end mill, forging dies, and jigs and tools such as blanking punch; a target used in forming such a coating; and a method for depositing a hard coating.

BACKGROUND OF THE INVENTION

Cutting tools have been provided with wear resistance by forming a hard coating of TiN, TiCN, TiAlN, or the like on a substrate of high speed steel, cemented carbide, cermet, and the like. In particular, TiAlN has been the favorable choice in the case of the coating formed on a high speed cutting tool or a hardened cutting tool of, for example, hardened steel. With the recent increase in the hardness of the material to be cut by the cutting tool and increase in the cutting speed, development of a hard coating having an improved wear resistance is highly demanded. JP-A No. 2003-71610, for example, discloses that use of TiCrAlN instead of the TiAlN increases proportion of the AlN having rock-salt structure in the coating, and the coating hardness is thereby improved simultaneously with oxidation resistance.

The hard coating comprising TiAlN or TiCrAlN, however, is insufficient in lubricity in spite of the improved oxidation resistance at the high temperature. Accordingly, cutting tools having such hard coating formed thereon often suffered from sticking of a part of the work piece onto the surface of the cutting tool during the cutting operation. Jigs and tools such as forging dye and blanking punch also suffered from unduly increased frictional resistance at the contact surface, and they occasionally experienced baking of the processed material onto the jig or the tool during the forging and pressing.

SUMMARY OF THE INVENTION

The present invention has been completed in view of the situation as described above, and an object of the present invention is to provide a hard coating which has excellent hardness and lubricity, as well as related technologies.

According to one aspect of the present invention, a hard coating is provided which has overcome the situation as described above. This hard coating is (1) a hard coating comprising $(Al_{1-a}V_a)(C_{1-x}N_x)$ wherein $0.27 \leq a \leq 0.75$, and $0.3 \leq X \leq 1$, wherein a and X independently represent an atomic ratio; or (2) a hard coating comprising $(Al_{1-a-b-c}V_aSi_bB_c)(C_{1-x}N_x)$ wherein $0.1 \leq a \leq 0.75$, $0 < b+c \leq 0.20$, and $0.3 \leq X \leq 1$, wherein a, b, c, and X independently represent an atomic ratio with the proviso that b and c are not simultaneously 0 while one of b and c may be 0.

The hard coating may be a multilayer hard coating, and such multilayer hard coating may be broadly divided into the following two embodiments. The first embodiment of the multilayer hard coating is the one produced by repeatedly depositing a thin layer comprising a nitride or a carbonitride of at least one element selected from Al, V, Si, and B. The periodicity is not more than 80 nm and the average composition calculated by multiplying the composition and the thickness of each layer and dividing the sum of the products by the thickness of the entire layer satisfies the composition of the above (1) or (2). The second embodiment of the multilayer hard coating is the one produced by repeatedly depositing (a) a thin layer comprising a nitride or a carbonitride of TiAl and/or a thin layer comprising a nitride or a carbonitride of CrAl, and (b) a thin layer having the composition satisfying the hard coating as described above. The periodicity is not more than 80 nm.

The hard coating (including the multilayer hard coating) preferably has a NaCl-type crystal structure. The hard coating of the present invention exhibits both excellent hardness and excellent lubricity.

The hard coating (including the multilayer hard coating) may be disposed one on another (hereinafter sometimes referred to as laminate hard coating). In such a laminate hard coating, each hard coating is different from its adjacent hard coating layers.

The hard coating (including the multilayer hard coating and the laminate hard coating) may have deposited on one or both of its surfaces (1) a different hard coating or (2) a metal layer or an alloy layer (hereinafter sometimes referred to as a composite hard coating).

(1) Examples of the different hard coating include a hard coating comprising a metal nitride, a metal carbonate, or a metal carbonitride having a NaCl-type crystal structure.

(2) Examples of the metal layer or the alloy layer include a layer of at least one metal selected from elements of Groups 4A, 5A, and 6A in the Periodic Table, Al, and Si, and alloys thereof.

The hard coatings (1) and (2) may further contain Mo and/or W, and namely, these coatings may be (3) a hard coating comprising $(Al_{1-a-d-e}V_aMo_dW_e)(C_{1-x}N_x)$ wherein $0.2 \leq a \leq 0.75$, $0 < d+e \leq 0.3$, and $0.3 \leq X \leq 1$, wherein a, d, e, and X independently represent an atomic ratio with the proviso that d and e are not simultaneously 0 while one of d and e may be 0, or (4) a hard coating comprising $(Al_{1-a-b-c-d-e}V_aSi_bB_cMo_dW_e)(C_{1-x}N_x)$ wherein $0.2 \leq a \leq 0.75$, $0 < b+c \leq 0.20$, $0 < d+e \leq 0.3$, and $0.3 \leq X \leq 1$, wherein a, b, c, d, e, and X independently represent an atomic ratio with the proviso that b and c are not simultaneously 0 while one of b and c may be 0, and d and e are not simultaneously 0 while one of d and e may be 0.

The hard coating containing Mo and/or W is particularly excellent in lubricity and durability when used in a cutting tool under the high temperature conditions of 600° C. or higher.

The hard coatings (1) and (2) may further contain Zr and/or Hf, and namely, these coatings may be (5) a hard coating comprising $(Al_{1-a-f-g}V_aHf_fZr_g)(C_{1-x}N_x)$ wherein $0.01 \leq a \leq 0.75$, $0 < f+g \leq 0.5$, and $0.3 \leq X \leq 1$, wherein a, f, g and X independently represent an atomic ratio with the proviso that f and g are not simultaneously 0 while one of f and g may be 0, or (6) a hard coating comprising $(Al_{1-a-b-c-f-g}V_aSi_bB_cHf_fZr_g)(C_{1-x}N_x)$ wherein $0.01 \leq a \leq 0.75$, $0 < b+c \leq 0.20$, $0 < f+g \leq 0.5$, and $0.3 \leq X \leq 1$, wherein a, b, c, f, g, and X independently represent an atomic ratio with the proviso that b and c are not simultaneously 0 while one of b and c may be 0, and f and g are not simultaneously 0 while one of f and g may be 0.

The hard coating containing Zr and/or Hr is particularly excellent in hardness under the high temperature conditions of 600° C. or higher.

The hard coatings (3) to (6) may preferably exhibit NaCl-type crystal structure.

Also preferred is a laminate hard coating comprising a layer comprising the hard coating of the above (1) or (2) (hereafter referred to as layer A), and a layer comprising a compound obtained by selecting at least one of Mo and W and at least one of C and N (hereafter referred to as layer B). In this case, the thickness of the layer A and the layer B is preferably such that: the thickness of layer B≦the thickness of layer A≦200 nm.

Also preferred is a laminate hard coating comprising a layer comprising a hard coating of any one of the above (1) or (2) (hereafter referred to as layer A), and a layer comprising a compound obtained by selecting at least one of Zr and Hf and at least one of C and N (hereafter referred to as layer C). In this case, the thickness of the layer A and the layer C is preferably such that: the thickness of layer C≦the thickness of layer A≦200 nm.

According to another aspect of the present invention, a hard coating deposited by arc ion plating is provided. This coating is deposited in a gas containing 30 to 100% by atom of N in relation to the sum of N and C by using a target comprising $(Al_{1-a}Va)$ wherein $0.27 \leq a \leq 0.75$ wherein a represents an atomic ratio, or a target comprising $(Al_{1-a-b-c}V_aSi_bB_c)$ wherein $0.1 \leq a \leq 0.75$ and $0 < b+c \leq 0.20$ wherein a, b, and c independently represent an atomic ratio with the proviso that b and c are not simultaneously 0 while one of b and c may be 0.

According to further aspect of the present invention, a target for depositing a hard coating is provided. This target comprises any one of the following elements (i) to (iv):
(i) Al and V,
(ii) Al, V, and Si,
(iii) Al, V, and B, and
(iv) Al, V, Si, and B, and the target has a relative density of not less than 95%.

Also provided by the present invention is a target for depositing a hard coating, comprising $(Al_{1-a}V_a)$ wherein $0.27 \leq a \leq 0.75$, wherein a represents an atomic ratio, and a target for depositing a hard coating, comprising $(Al_{1-a-b-c}V_aSi_bB_c)$ wherein $0.1 \leq a \leq 0.75$, and $0 < b+c \leq 0.20$, wherein a, b, and c independently represent an atomic ratio with the proviso that b and c are not simultaneously 0 while one of b and c may be 0.

The hard coating may be produced, for example, by evaporating a metal in a film-forming gas atmosphere for ionization and promoting plasmatization of the film-forming gas together with the ionization of said metal for the deposition of the coating More specifically, in arc ion plating in which the metal constituting the target is evaporated and ionized by arc discharge, parallel or divergent lines of magnetic force that extend in a direction substantially perpendicular to the evaporation surface of the target are formed, and plasmatization of the film-forming gas is promoted near the object piece by these lines of magnetic force for depositing the coating.

In such stage, magnetic flux density at a surface of the object piece on which the hard coating is to be coated is not less than 10 gauss. In addition, a magnetic field is preferably formed between the target and the object piece such that the angle formed between the lines of magnetic force and the normal line of said target evaporation surface is not more than ±30°.

In the hard coating of the present invention, the Al of the Al nitride or the Al carbonitride hard coating has been replaced with an adequate amount of V, and therefore, it has excellent hardness and lubricity. A cutting tool having such hard coating will have an elongated life, and a jig or a tool having such hard coating will experience less seizing.

BRIEF DESCRIPTION OF THE DRAWINGS

Embodiments of the present invention will be described in detail based on the following figures, wherein.

DETAILED DESCRIPTION OF THE PREFERRED EMBODIMENTS

The inventors of the present invention have prepared various hard coatings and evaluated these coatings for their crystal structure, hardness, surface frictional resistance, and durability when deposited on a cutting tool in order to find a coating which is better than TiAlN and TiAlCN hard coatings (hereinafter sometimes generally referred to as TiAl-based hard coatings). The inventors then found that a nitride and a carbonitride produced by combining V with Al instead of Ti (for example, VAlN and VAlCN which are hereinafter sometimes generally referred to as VAl-based hard coatings) exhibit excellent hardness and lubricity (surface frictional resistance). The present invention is based on such a finding.

More specifically, when a VAl-based hard coating is produced by replacing Ti of a TiAl-based hard coating with V, a V oxide ($V_2O_5$ etc.) is believed to be preferentially formed by the frictional heat generated at the boundary between the object piece or the work piece and the hard coating since V is relatively susceptible to oxidization, and since this V oxide is relatively soft and has a relatively low melting point, frictional resistance of the hard coating at the such boundary believed to become reduced. In addition, in the case of a VAl-based hard coating, hardness increases with the increase in the Al proportion as long as the NaCl-type crystal structure (also referred to as rock-salt structure, cubic system, or the like) is maintained, and when the Al proportion is excessively high, the NaCl-type crystal structure collapses to generate a hexagonal system (also referred to as ZnS type or the like) and the coating becomes soft. In the case of a VAl-based hard coating, the cubic system is maintained over a wider range of Al concentration compared with the TiAl-based hard coating, and this realizes a marked improvement in the hardness of the coating. Consequently, the VAl-based hard coating is simultaneously provided with the excellent hardness and the excellent lubricity.

Such VAl-based hard coating may be expressed as $(Al_{1-a}V_a)(C_{1-x}N_x)$ wherein "a" and "X" independently represent an atomic ratio. The "a" is not less than 0.27. When the "a" is too small, proportion of the Al will be excessively high and the coating will take hexagonal structure to invite decrease in the hardness (increase of the coefficient of friction). The "a" is preferably not less than 0.3, and in particular, not less than 0.35. The hardness and the lubricity are improved with the increase in the value of the "a". However, when the value of the "a" is too high, accumulation of the strain realized by the use of the Al with the V is reduced, and this invites decrease of the hardness and increase of the coefficient of friction. Accordingly, the "a" is preferably not more than 0.75, preferably not more than 0.6, and more preferably not more than 0.5.

While the "X" may be 1 (that is, the hard coating may be a nitride), lubricity of the coating increases with the decrease in the value of the "X" (that is, increase in the amount of C"). However, an excessively low "X" is likely to invite formation of unstable AlC compound. Accordingly, "X" is preferably not less than 0.3, preferably not less than 0.4, more preferably 0.5, and most preferably not less than 0.6.

The VAl-based hard coating may also have Si and/or B incorporated thereto. Such VAl-based hard coating having Si and/or B added may be expressed as $(Al_{1-a-b-c}V_aSi_bB_c)(C_{1-x}N_x)$. It is to be noted that $(Al_{1-a-b-c}V_aSi_bB_c)(C_{1-x}N_x)$ includes not only the compounds wherein B is forming a carbonitride, and $(Al_{1-a-b-c}V_aSi_bB_c)(C_{1-x}N_x)$ generally designates compounds including those wherein B is forming a boride with Al, V, and Si. In the formula, "a", "b", "c" and "X" independently represent an atomic ratio. Addition of Si and/or B results in the smaller size of the crystal grains in the VAl-based hard coating, and this invites improvement of the hardness. The mechanism of the crystal grain size reduction is not precisely found out. However, crystal grain growth is believed to be suppressed by the formation of Si—N bond and B—N bond in the grain boundary. In the VAl hard coating having the Si and/or B added thereto, the value of the "a" is not less than 0.1 (preferably not less than 0.27, more preferably not less than 0.3, and most preferably not less than 0.35), and not more than 0.75 (preferably not more than 0.6, and more preferably 0.5). The amount of the Si and/or the B added (b+c) is more than 0, preferably not less than 0.01, and more preferably not less than 0.05. It is to be noted that either one or both of Si and B may be added in the composition, and one of the "b" and "c" may be 0. However, addition of B is more favorable than addition of Si because it forms the B—N bond that imparts lubricity to the coating. Accordingly, when the improvement in the lubricity is desired, addition of both Si and B or addition of B is recommended. On the other hand, excessive addition of the Si and/or the B invites transition of the crystal structure of the VAl-based hard coating to the hexagonal system, and this may invite loss of hardness. Accordingly, the amount of the Si and/or the B added (b+c) is not more than 0.20, preferably not more than 0.15, and more preferably not less than 0.10, and in such a case, lower limit of the sum of the "a" and the "b+c" is preferably not less than 0.4, and in particular, not less than 0.5.

The hard coating of the present invention is not limited to the one as described above having a homogeneous composition, and also included in the hard coating of the present invention are those having a composition equivalent to the VAl-based hard coating (including the VAl-based hard coating having the Si or the B added, and this also applies in the following), the hard coating also having Mo and/or W incorporated thereto as will be described below, or the hard coating having Zr and/or Hf incorporated thereto as will be described below as the entire coating. For example, a coating produced by repeatedly depositing extremely thin layers at a periodicity of not more than about 80 nm (hereinafter referred to as a multilayer hard coating) is also within the scope of the hard coating of the present invention when the average composition falls within the composition of the VAl-based hard coating (or the hard coating also having Mo and/or W or the Zr and/or Hf incorporated thereto as will be described below) since the each layer constituting such coating would have lost the unique property due to the extreme thinness of the layer in the case of such multilayer hard coating (hereinafter sometimes referred to as the first multilayer hard coating) and the coating in its entirety exhibits the characteristics of the single layer coating. Such multilayer hard coating also has the merit that the coating can be produced by using a combination of known targets (such as AlN and AlVN) with no need to produce a unique target matching the composition of the coating. The term "average composition" means the composition represented by the proportion of the number of atoms present in the laminate per unit area and this average composition may be calculated, for example, by the procedure as described below. With regard to a laminate comprising layers A comprising $(V_aSi_b)N$ (thickness, X nm) and layers B comprising $(Al_cB_d)N$ (thickness, Y nm), for example, lattice constant ($\alpha$) and number of molecules (Z) per unit cell of the compound constituting the layer A and the layer B per $10^6$ nm$^2$ are determined by X ray diffraction. Composition of each layer A and layer B is calculated by AES or the like and the film thickness is calculated by TEM or the like. The resulting values are used to calculate number of V atoms per unit area (Vm) of the layer A by using the equation $10^6 \times X \times Z \times a/(\alpha^3)/(a+b)$ and number of Si atoms per unit area (Sim) by using the equation $10^6 \times X \times Z \times b/(\alpha^3)/(a+b)$ for the Si in the layer A. Similarly, number of Al and B atoms per unit area in the layer B [(Alm) and (Bm)] are determined. The thus obtained values of the number of atoms are used to calculate the proportion of the number of atoms per unit area [in the case of V, (Vm/(Vm+Sim+Alm+Bm))] to determine the average composition.

Upper limit of the periodicity is preferably 50 nm, more preferably 30 nm, and most preferably 15 nm. Homogeneity of the coating, the hardness, and the lubricity all improves with the decrease in the upper limit of the periodicity. No lower limit is set for the periodicity. However, distinction between the multilayer hard coating and the hard coating having the homogeneous composition becomes difficult with the decrease in the periodicity, and the lower limit may be, set, for example, at about 1 nm (and in particular, at about 3 nm). As long as the periodicity is within such range, thickness of the constituent layer is not particularly limited. The layer, however, may be in the range of, for example, not more than 50 nm, preferably not more than 30 nm, and more preferably not more than 10 nm.

The layers of the multilayer VAl-based hard coating generally comprise a nitride and a carbonitride [a nitride and a carbonitride may be hereinafter together referred to as a (carbo)nitride] of at least one element selected from Al, V, Si and B. Examples of the preferable (carbo)nitrides include Al-based (carbo) nitrides such as Al(CN), AlSi(CN), AlB(CN), and AlSiB(CN), and the foregoing compounds in which (CN) in the compound is (N); Si(CN), and B(CN). The combination of the layers is not particularly limited and the combination may be, for example, an Al-containing (carbo)nitride such as an Al-based (carbo)nitride or an AlV-based (carbo)nitride with an Al-free (carbo)nitride such as a v-based (carbo)nitride, Si(CN), or B(CN) Exemplary combinations include Al(CN)/V(CN), Al(CN)/VSi(CN), AlSi(CN)/V(CN), AlSi(CN)/VB(CN), AlB(CN)/V(CN), AlB(CN)/VSi(CN), AlSiB(CN)/V(CN), AlV(CN)/Si(CN), AlV(CN)/B(CN), AlVSi(CN)/B(CN), AlVB(CN)/Si(CN), and AlVSiB(CN)/AlV(CN), and in the above exemplary combinations, the (CN) moiety may be (N).

The multilayer hard coating may also be the one comprising at least one hard coating layer having same composition as the VAl-based hard coating (including the hard coating having the Si or the B added), or the hard coating also having Mo and/or W incorporated thereto as will be described below, or the hard coating having Zr and/or Hf incorporated thereto as will be described below (including those having the Si or the B added); and the remaining layers having the composition which does not significantly impair the properties of such hard coating (the second multilayer hard coating). In the case of such second multilayer hard coating, the properties of the overall coating is determined by the properties of the hard coating, and therefore, it has excellent hardness and lubricity, and such coating is also within the scope of the hard coating of the present invention.

Examples of such remaining layers having the composition which does not significantly impair the properties of such hard coating include a layer comprising a nitride or a carbonitride of TiAl, and a layer comprising a nitride or a carbonitride of CrAl. These layers exhibit excellent oxidation resistance, and when such layer is laminated with the hard coating (a VAl-based hard coating or a VAl-based hard coating having the Si and/or the B added thereto), the resulting laminate hard coating would be provided with the improved oxidation resistance. As long as such remaining layers and the hard coatings are laminated one on another, the number of the remaining layers is not limited, and the laminate hard coating may include one or more such remaining layer.

The upper limit and the lower limit of the periodicity and the upper limit and the lower limit of each layer may be the same as the first multilayer hard coating.

The thickness of the hard coating (total thickness of the layers when the hard coating comprises a plurality of layers) is typically not less than 0.5 times (preferably not less than 0.8 times, and most preferably not less than 1.0 times) that of the remaining layers, and not more than 2.0 times (preferably not more than 1.5 times) that of the remaining layers. The hard layer is less likely to be affected by the remaining layers when the proportion of the hard coating is higher in relation to the remaining layers. Upper limit of the thickness of the hard layer in relation to the remaining layers is not particularly limited, and the higher proportion merely means that such coating would be difficult to distinguish from the hard coating having a homogeneous composition. The upper limit, however, maybe about 10 times (and in particular, about 5 times, and typically, about 2 times).

In the case of a VAl-based hard coating (including the one having Si and/or B added), a V oxide which is relatively low melting and soft is preferentially formed as described above by the friction at the boundary between the work piece (or the piece being cut), and this is believed to improve the hardness and the lubricity. The melting point of the V oxide, however, is around 600° C., and sliding under the temperature condition higher than that may lead to oxidation of the V component in the coating and the resulting susceptibility to degradation of the coating. In view of such situation, the inventors of the present invention paid attention to Mo and W which form oxides having a melting point higher than that of the V oxide, and succeeded in forming oxides having a melting point higher than that of the V oxide [$WO_2$ (melting point, 1500° C.), $WO_3$ (melting point, 1470° C.), $MoO_2$ (melting point, 1100° C.), and $MoO_3$ (melting point, 795 to 801° C.)] by using Mo and W along with the (AlV) and (AlVSiB) components. The inventors also found that Such hard coating (herein after referred to as a VAl-based hard coating having Mo and/or W incorporated therein, or simply as a hard coating also containing Mo and/or W, and this VAl-based hard coating having Mo and/or W incorporated therein may additionally contain Si and/or B) is capable of suppressing the oxidation speed even under high temperature conditions of 600° C. or more, and also capable of improving the wear resistance and suppress the coefficient of friction to a lower level.

The coefficient of friction can be suppressed and the wear resistance can be improved when the content of the Mo and/or the W (atomic ratio) (that is, the value of "d+e" when the compound is expressed as $(Al_{1-a-d-e}V_aMo_dW_e)(C_{1-x}N_x)$ or $(Al_{1-a-b-c-d-e}V_aSi_bB_cMo_dW_e)(C_{1-x}N_x)$ as in the case of the VAl-based hard coating as described above) is typically more than 0, preferably not less than 0.05, and more preferably not less than 0.1. However, when these elements are incorporated at an excessively high content, crystal structure of the hard coating becomes more susceptible to undergoing transition from the hard NaCl-type structure to the soft hexagonal-type structure detracting from the wear resistance. Accordingly, the content of these elements (the value of "d+e") is desirably controlled to not more than 0.3 (and preferably not more than 0.2).

By the way, the VN and the AlN (pure and stable cubic structure) in the hard coating have a lattice constant of 0.414 nm and 0.412 nm, respectively, while ZrN and HfN respectively have a lattice constant of 0.456 nm and 0.452 nm, which are larger than those of VN and AlN. Accordingly, in a hard coating having formed therein a compound such as ZrN and HfN having a lattice constant different from those of the VN and the AlN (hereinafter referred to a VAl-based hard coating also having Zr and/or Hf incorporated therein, or simply as a hard coating also containing Zr and/or Hf, and this VAl-based hard coating having Zr and/or Hf incorporated therein may additionally contain Si and/or B), hardness can be improved by promoting the hardening by lattice strain.

The hardness and the wear resistance can be improved when the content of the Zr and/or the Hf (atomic ratio) (that is, the value of "f+g" when the compound is expressed as $(Al_{1-a-f-g}V_aHf_fZr_g)(C_{1-x}N_x)$ or $(Al_{-a-b-c-f-g}V_aSi_bB_cHf_fZ_r)(C_{1-x}N_x)$ as in the case of the VAl-based hard coating as described above) is typically more than 0, preferably not less than 0.1, and more preferably not less than 0.2. However, when these elements are incorporated at an excessively high content, crystal structure of the hard coating becomes more susceptible to undergoing transition to the hexagonal structure detracting from the wear resistance. Accordingly, these elements are desirably incorporated at a content of not more than 0.5 (preferably not more than 0.4, and not more than 0.3).

In the hard coating also containing Mo and/or W or the hard coating also containing Zr and/or Hf, the coating may have a content of the V, Si, B, C, and N (that is, the values "a", "b+c" and "X" in the above chemical formula) similar to the VAl-based hard coating (including the hard coating having the Si or the B added) as described above. However, Mo, W, Hf, and Zr have the effect of improving the wear resistance as described above, and therefore, the lower limit of the content of V (the value of "a") maybe lower than those of the VAl-based hard coating or the VAl-based hard coating including the hard coating having the Si or the B added. The lower limit for the content of V (the value of "a") in the hard coating also containing Mo and/or W may be 0.2 (preferably 0.27, more preferably 0.3, and most preferably 0.35), and the lower limit for the content of V in the hard coating also containing Zr and/or Hf may be 0.01 (preferably 0.2, more preferably 0.27, still more preferably 0.3, and most preferably 0.35).

The Mo and/or the W, or the Zr and/or the Hf may be incorporated in the hard coating not only by producing a single layer hard coating containing such elements in its interior, but also by producing a laminate hard coating comprising the VAl-based hard coating (including the hard coating having the Si or the B added, and hereinafter referred to as layer A) and a layer of a compound produced from at least one of Mo and W and at least one of C and N (hereinafter referred to as layer B), or a layer of a compound produced from at least one of Zr and Hf and at least one of C and N (hereinafter referred to as layer C).

Metals such as Mo and/or W, or Hf and/or Zr are insufficient in the hardness, and deposition of such metal in the form of simple substance will invite loss of the wear resistance of the overall laminate hard film. Therefore, these metals should be used with C and/or N in the form of a carbonitride-based compound. However, even when the metals such as Mo and/or W, or Hf and/or Zr are incorporated in the carbonitride-based compound, such compound is still inferior in the hardness compared with the VAl-based hard coating (including the hard coating having the Si or the B added), and therefore, the hardness and the wear resistance of the overall hard coating will be insufficient if the layer of the carbonitride-based compound of the Mo, W, Hf, or Zr is thicker than the VAl-based hard coating. Therefore, the layer B and the layer C are preferably deposited so that they would be thinner than the layer A. Furthermore, the thickness of respective layer is preferably controlled to not more than 200 nm (preferably not more than 50 nm, and more preferably not more than 20 nm) since the advantage of producing a laminate coating is lost when the thickness of each layer exceeds a certain level.

The hard coating of the present invention [the VAl-based hard coating (including the hard coating having the Si or the B added), the VAl-based hard coating also coating Mo and/or W (including the hard coating having the Si or the B added), the VAl-based hard coating also coating Zr and/or Hf (including the hard coating having the Si or the B added), a multilayer hard coating, or the like] may have a mixed crystal structure including both the cubic and hexagonal structures as long as the coating exhibits the hardness and the lubricity (coefficient of friction) of satisfactory level. The coating will exhibit an increased hardness with the increase in the proportion of the cubic crystal structure.

Whether the crystal structure is NaCl-type or not may be determined by X ray diffraction. More specifically, peak strength of the (111), (200), and (220) surfaces of the cubic crystal and the peak strength of the (100), (102), (110) surfaces of the hexagonal crystal are measured, and the proportion of the cubic crystal is calculated by the following equation (1). The crystal structure of coating may be determined to be NaCl-type when the thus calculated proportion of the cubic crystal is not less than 0.7, preferably not less than 0.8, and not less than 0.9. In the coating having a mixed crystal structure in which this proportion is less than 0.7, this proportion is preferably not less than 0.4, and in particular, not less than 0.5.

$$\frac{IB(111) + IB(200) + IB(220)}{IB(111) + IB(200) + IB(220) + IH(100) + IH(102) + IH(110)} \quad (1)$$

wherein IB(111), IB(200), and IB(220) respectively represent peak strength of the surfaces of the cubic crystal, and IH(100), IH(102), and IH(110) respectively represent peak strength of the surfaces of the hexagonal crystal.

The X ray diffractometry is conducted by θ-2θ method. The X ray diffractometry of the cubic crystal is conducted by using a CuKα source, and the peak strength is measured, at, for example, about 2θ=37.78° for the (111) surface, at, for example, about 2θ=43.9° for the (200) surface, and at, for example, about 2θ=63.8° for the surface (220). The X ray diffractometry of the hexagonal crystal is conducted by using a CuKα source, and the peak strength is measured at, for example, about 2θ=32° to 33° for the (100) surface, at, for example, about 2θ=48° to 50° for the (102) surface, and at, for example, about 2θ=57° to 58° for the (110) surface.

The peak positions indicated above for the cubic and hexagonal crystals are those in accordance with the JCPDS card. The peak position of each surface of the crystal, and in particular, the hexagonal crystal (ZnS-type crystal) is sometimes deviated from the value indicated in JCPDS card when Ti, V, Cr, Mo, Ta, W, or the like is included in the crystal. In such a case, the target peak position may be determined by considering the relation with other peak positions or the relation with the peaks of other compounds.

Another hard coating different from the hard coating as described above, a metal layer, or an alloy layer may be deposited on at least one surface of the hard coating to thereby produce a composite hard coating.

The hard coating different from the hard coating as described above is, more accurately, a hard coating of a metal nitride, a metal carbide, or a metal carbonitride having a NaCl-type crystal structure, which may be selected depending on the intended use of the coating. Typical examples include Cr-based hard coatings such as Cr(CN) and CrAl(CN), and those wherein the (CN) moiety is (N) or (C); Ti-based hard coatings such as Ti(CN), TiAl(CN), and TiSi(CN), and those wherein the (CN) moiety is (N) or (C); and TiCr-based hard coatings such as TiAlCr(CN) and those wherein the (CN) moiety is (N) or (C).

The metal layer or the alloy layer is, more accurately, a layer of at least one metal selected from elements of Groups 4A, 5A, and 6A in the Periodic Table, Al, and Si, and alloys thereof, and since such layer has a hardness lower than that of the hard coating of the present invention, formation of the hard coating on the metal layer or the alloy layer intervening the hard coating and the object piece (in particular, an iron-based substrate comprising, for example, a high speed tool steel (e.g. SKH51or SKD) which exhibits a relatively low adhesion with the hard coating) improves adhesion between the hard coating and the object piece. The metal layer or the alloy layer is typically a layer comprising Cr, Ti, Nb or Ti—Al.

The hard coating (including the laminate hard coating and the composite hard coating) may be deposited to a thickness adequately selected depending on the intended use. The thickness, however, is preferably not less than 0.5 μm (preferably not less than 1 μm) and not more than 20 μm (preferably not more than 15 μm, and more preferably not more than 10 μm).

Examples of the iron substrate on which the hard coating is deposited include those comprising a high speed tool steel (SKH51, SKD11, SKD61, etc.) and cemented carbide.

The hard coating may be formed by a method known in the art such as physical vapor deposition (PVD) or chemical vapor deposition (CVD), and preferably, by PVD such as sputtering, vacuum deposition, and ion plating in view of the adhesion and the like. Preferably, the hard coating is desirably formed by vapor deposition such as such as sputtering and ion plating (and in particular, arc ion plating.

More specifically, the VAl-based hard coating or the VAl-based hard coating having the Si and/or the B added thereto may be produced by vapor deposition, and preferably, by arc ion plating in the presence of a film forming gas using the following target (i) to (iv):

(i) Al and V,
(ii) Al, V, and Si,
(iii) Al, V, and B, and
(iv) Al, V, Si, and B.

More specifically,
when a hard coating comprising $(Al_{1-a}V_a)(C_{1-x}N_x)$ is to be deposited, a target comprising $(Al_{1-a}V_a)$ wherein $0.27 \leq a \leq 0.75$ (wherein a represents an atomic ratio) may be employed, and when a hard coating comprising $(Al_{1-a-b-c}V_a Si_b B_c)(C_{1-x}N_x)$ is to be deposited, a target comprising $(Al_{1-a-b-c}V_a Si_b B_c)$ wherein $0.1 \leq a \leq 0.75$, and $0 < b+c \leq 0.20$ (wherein a, b, and c independently represent an atomic ratio with the proviso that b and c are not simultaneously 0 while one of b and c may be 0) may be employed.

The target used in producing the hard coating also having Mo and/or W or the Zr and/or Hf incorporated thereto may be a target of the above (i) to (iv) further comprising the Mo and/or the W, or the Zr and/or the Hf.

The inventors of the present invention also investigated the properties of the target, and found that a target having a relatively low density is likely to be associated with microspores, and the non-uniform evaporation of the target results in the formation of a non-uniform hard coating, and the low density target experiences local and rapid consumption at the void portion of the target during the deposition of the coating, and the fast wearing speed of the target results in the reduced target life. The inventors also found that the large portion of the void in the target results in the reduced target strength as well as generation of cracks and the like. This problem could be solved by increasing the relative density of the target to the degree of not less than 95% (preferably not less than 98%). Use of such target also enables stabilization of the discharge state in the evaporation or ionization of the alloy component constituting the target by the arc discharge, thereby enabling production of the good hard coating.

The relative density used is the value determined by the formula: [(Weight of 1 cm³ of the target employed)/(Density of a target having pure composition (theoretical density))× 100]. The theoretical density can be calculated by using the method known in the art.

The production method of the target is not particularly limited. The target is produced, for example, by homogeneously mixing the starting material (V powder and Al powder) having adequately adjusted component ratio and particle size in a V blender or the like to produce a powder mixture, and producing the target from the mixture by cold isostatic pressing (CIP), hot isostatic pressing (HIP), hot extrusion, ultra-high pressure hot pressing, or the like.

Figure 2:
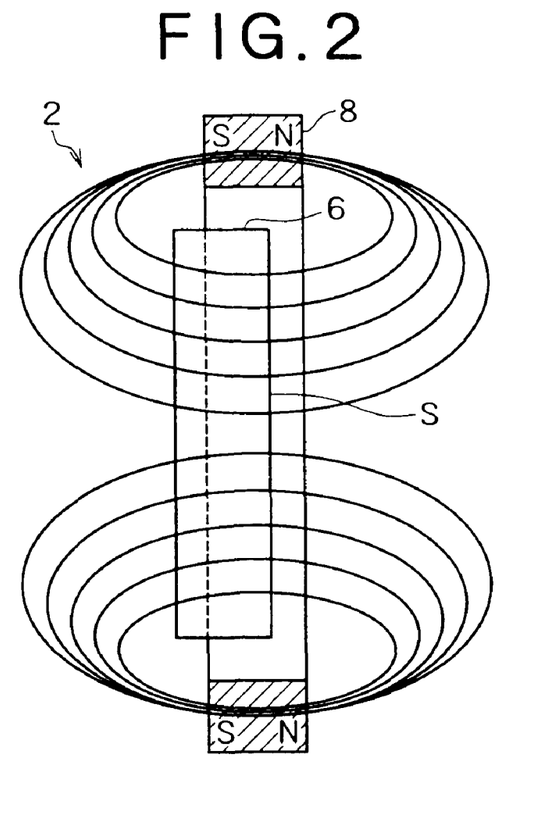
FIG. 2 is a schematic view showing the distribution of the lines of magnetic force formed near the object piece in the production method of the present invention.
Figure 3:
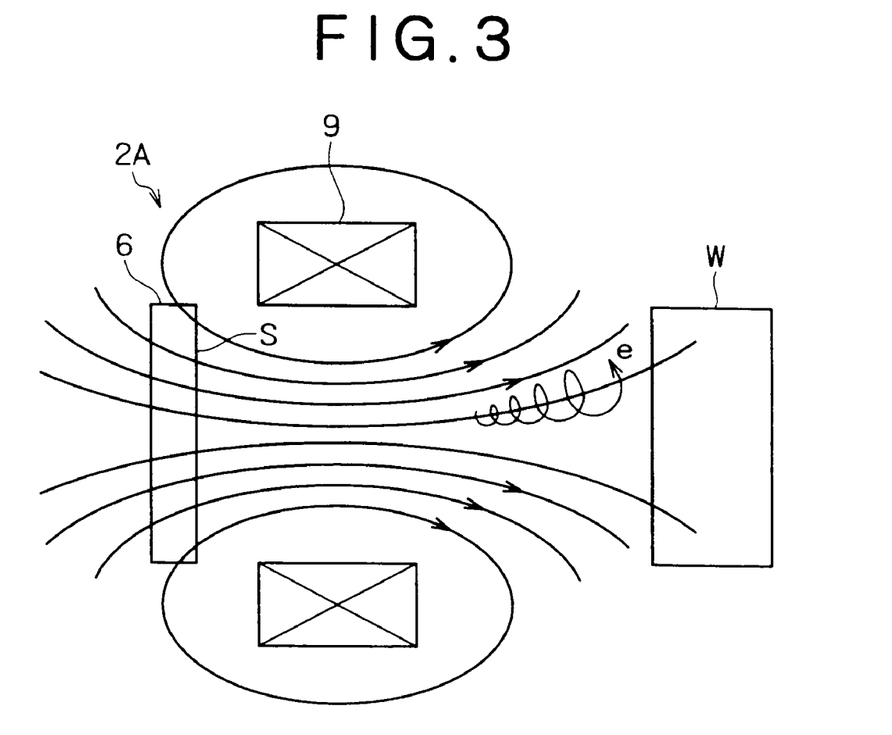
FIG. 3 is a schematic view showing the distribution of the lines of magnetic force formed near the object piece in the production method of the present invention.
Figure 4:
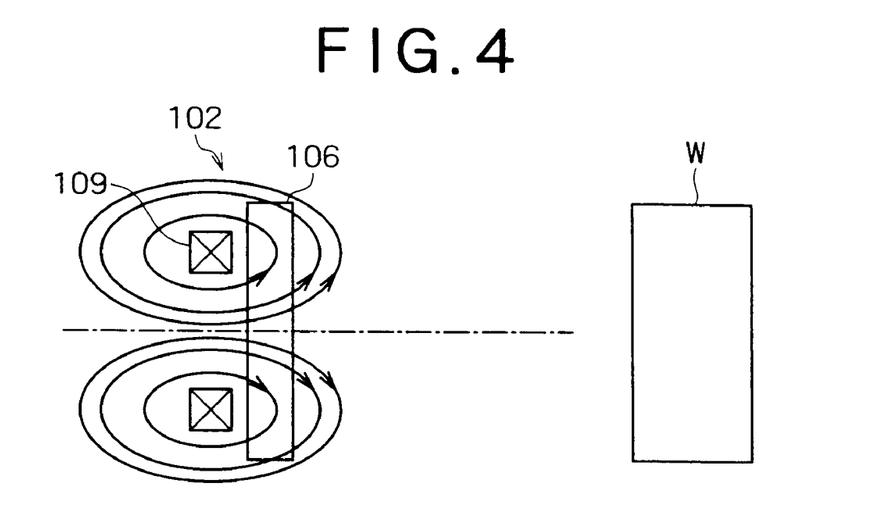
FIG. 4 is a schematic view showing the distribution of the lines of magnetic force formed in the conventional arc ion plating.

The inventors of the present invention also investigated the apparatus for depositing the hard coating by arc ion plating, and found that, in the apparatus used in the conventional AIP, target 106 is placed between magnet 109 generating the magnetic field and work piece W, and therefore, lines of magnetic force 102 generated by the magnet 109 are substantially parallel to the target surface near the evaporation surface of the target as schematically shown in FIG. 4, and the lines of magnetic force 102 are less likely to extend to the vicinity of the work piece W. As a consequence, density of the plasma of the film forming gas which is high near the target decreases toward the work piece W. The inventors found that the hard coating can be efficiently deposited when the lines of magnetic force are generated so that they extend almost perpendicular to the evaporation surface of the target, and a portion of the electrons e generated by the discharge will collide with the N and/or the C of the gas to facilitate plasmatization of the N and/or the C. More specifically, when a magnet or a means for generating magnetic field (also referred in the present invention as magnetic field generating means) 8 or 9 such as an electromagnet equipped with a coil and a power source for the coil is placed between a target 6 and the work piece W as shown in FIGS. 2 and 3, the angle formed between the lines of magnetic force and the line normal to the evaporating surface of the target 6 will be not less than ±30° (and preferably not less than 20°). Also, when the magnetic flux density is increased near the target and near the object piece to the level higher than the conventional AIP apparatus, generation of AlN having a rock salt-type crystal structure which is in non-equilibrium state at standard temperature and standard pressure can be promoted to thereby improve the hardness of the coating. Furthermore, plasmatization of the materials formed by the evaporation of the target and plasmatization of N in the atmospheric can be promoted to facilitate formation of high energy particles from the plasmatized N, and the inventors believe that this facilitates formation of the AlN having the rock salt-type structure in the non-equilibrium state.

The position where the magnetic field generating means is located may be above the target 6 and/or on the side of the evaporating surface S of the target 6 so that the target is surrounded or sandwiched by the magnetic field generating means as shown in FIG. 2, or the magnetic field generating means 9 may be placed between the evaporating surface S of the target and the work piece W as shown in FIG. 3. Alternatively, the chamber may be used as an anode as shown in FIG. 2, or a special-purpose cylindrical anode surrounding the front half of the periphery of the target may be provided.

The intensity of the magnetic field generated may be adjusted so that the magnetic flux density at the central portion of the surface of the object piece on which the hard coating is to be formed would be not less than 10 gauss (and preferably not less than 30 gauss).

The film forming gas may be selected depending on the composition of the desired hard coating, and typically, such that N in relation to the total of the N and C atoms would be not less than 0.3% (and preferably not less than 0.4%, more preferably not less than 0.6%, andmost preferably not less than 0.8%).

The temperature of the object piece during deposition of the hard coating may be adequately selected depending on the type of the object piece. When the temperature is too low, residual stress of the hard coating may be increased, and an excessive residual stress acting on the hard coating may adversely affect the adhesion of the hard coating with the object piece. Accordingly, the temperature of the object piece is desirably adjusted to not less than 300° C., and preferably not less than 400° C. While the residual stress will be reduced with the increase in the temperature of the object piece, an excessively high temperature of the object piece will invite simultaneous decrease of the compressive stress, and this may adversely affect the effect of the coating in improving the bending resistance of the object piece. Such high temperature may also invite deformation of the object piece. Accordingly, the temperature of the object piece is desirably adjusted to not more than 800° C., and preferably not more than 700° C. When the object piece is a substrate of an HSS (high speed tool steel) such as SKH51 or a hot-working tool steel such as SKD11 or SKD61, the temperature of the substrate during the production is preferably maintained so that it does not exceed tempering temperature of the substrate material to thereby maintain the mechanical properties of the substrate. While the tempering temperature maybe selected depending on the substrate material, the tempering temperature is generally in the range of 550 to 570° C. when SKH51 is used for the substrate, and 500 to 530° C. when SKD11 is used for the substrate. In such a case, the temperature at the production of the substrate is preferably selected to be lower than such tempering temperature, and typically, at a temperature not exceeding 50° C. below the tempering temperature.

The hard coating can be efficiently formed when a negative potential is applied to the object piece during the formation of the coating. The bias voltage applied is preferably a negative voltage of not less than 10 V, and in particular, not less than 30 V in absolute value since the higher vias voltage results in the higher energy of the plasmatized film forming gas and metal ions, and formation of a hard coating having a cubic crystal structure is facilitated. However, increase in the bias voltage is sometimes associated with an extreme decrease in the deposition speed of the coating due to etching of the coating by the plasmatized film forming gas. Accordingly, the bias voltage is preferably maintained at a negative voltage of not more than 200 V, and in particular, not more than 150 V in absolute value. When the Al content is relatively low, the lock in as described above will be effective even when if the bias voltage were somewhat low, and a hard coating having cubic crystal structure is likely be deposited.

Figure 5:
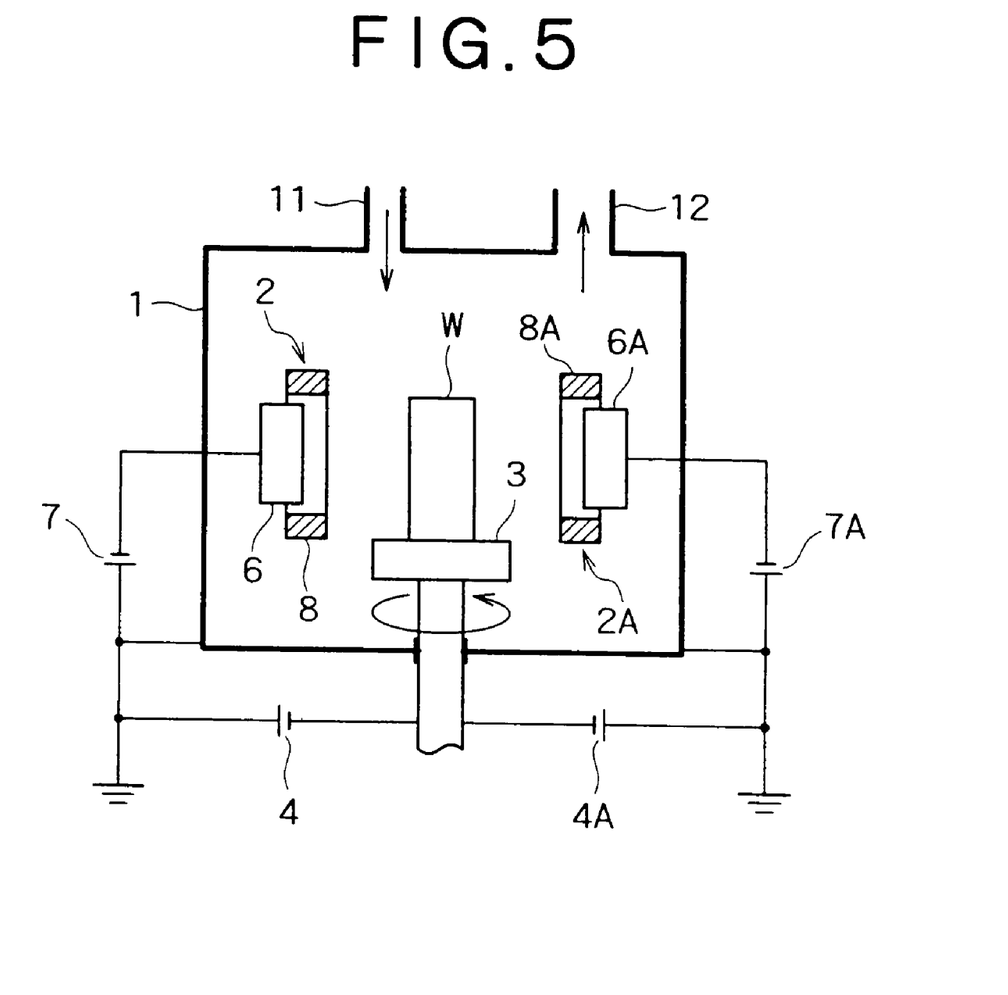
FIG. 5 is a schematic view of the production apparatus used in the production method of the present invention.

When the hard coating is produced as a laminate comprising a plurality of hard coatings, such laminate coating may be produced, for example, by using an apparatus as shown in FIG. 5 provided with a plurality of target 6A and magnetic field generating means 8A and forming each layer by the procedure as described above.

EXAMPLES

The hard coatings obtained in the following Experimental Examples were evaluated for their physical properties by the method as described below.

[Composition of the Hard Coating]

The composition was determined by EPMA. In this procedure, it was also confirmed that content of the impurity other than metal elements and nitrogen, content of the oxygen, and content of the carbon are respectively not more than 5 at %.

[Conditions Used in Analyzing the Crystal Structure]

The hard coating was evaluated for the crystal structure by X ray diffraction by θ-2θ method using X ray diffractometer manufactured by Rigaku Electric. The X ray diffractometry of the cubic crystal was conducted by using a CuKα source, and the peak strength was measured, at about 2θ=37.78° for the (111) surface at about 2θ=43.9° for the (200) surface, and at about 2θ=63.8° for the surface (220). The X ray diffractometry of the hexagonal crystal was conducted by using a CuKα source, and the peak strength was measured at about 2θ=32° to 33° for the (100) surface, at about 2θ=48° to 50° for the (102) surface, and at about 2θ=57° to 58° for the (110) surface. The resulting values were used in the following equation (1):

$$\frac{IB(111) + IB(200) + IB(220)}{IB(111) + IB(200) + IB(220) + IH(100) + IH(102) + IH(110)} \quad (1)$$

wherein IB(111), IB(200), and IB(220) respectively represent peak strength of the surfaces of the cubic crystal, and IH(100), IH(102), and IH(110) respectively represent peak strength of the surfaces of the hexagonal crystal. When the calculated value ("The value of equation (1)" in Table 1) was not less than 0.8, the coating was determined to have NaCl-type structure (indicated in Table 1 as "B"); when the value was 0, the coating was determined to have hexagonal structure (indicated in Table 1 as "H"); and when the value was more than 0 and less than 0.8, the coating was determined to have a mixed structure (indicated in Table 1 as "B+H").

[Measurement of the Hardness]

The hardness was measured by a micro Vickers hardness tester at a load of 0.25 N and retention time of 15 seconds.

[Measurement of the Coefficient of Friction]

The hard coating of the present invention was used on the surface of a test disk for sliding test (made of SKD61; diameter, 55 mm; thickness, 5 mm; mirror finished on one surface), and the coating was evaluated for its coefficient of friction under the following test conditions.

Conditions of the Sliding Test

Test method: ball on disk

Ball: SUJ2 (diameter, 9.54 mm); Hardness, HRC60

Vertical load: 5 N

Sliding speed: 1 m/s

Atmosphere temperature: 500° C. for Experimental Examples 1 to 4, and 800° C. for Experimental Examples 5 to 8.

Sliding distance: 1000 m

[Observation of the Wear Width]

The hard coating of the present invention was deposited on an end mill of a cemented carbide (diameter 10 mm; 2 teeth) and cut to the predetermined cutting length under the following the following conditions A (Experimental Examples 1 to 4) and the following conditions B (Experimental Examples 5 to 8), and the tip of the end mill covered with the hard coating was observed under an optical microscope.

Conditions A
 Work piece: SKD61 hardened steel (HRC50)
 Cutting rate: 220 m/minute
 Feed rate: 0.06 mm/tooth
 Axial cutting depth: 4.5 mm
 Radial cutting depth: 1 mm
 Misc.: only down cut, dry cut, and air blow
 Cutting length: 20 m Conditions B
 Work piece: SKD11(HRC60)
 Cutting rate: 150 m/minute
 Feed rate: 0.04 mm/tooth
 Axial cutting depth: 4.5 mm
 Radial cutting depth: 0.2 mm
 Misc.: only down cut, dry cut, and air blow
 Cutting length: 50 m

[The Apparatus Used in Depositing the Hard Coating]

Figure 1:
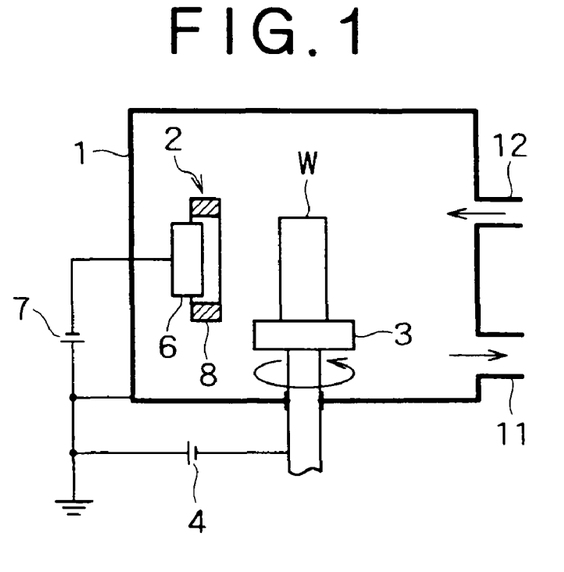
FIG. 1 is a schematic view of the production apparatus used in the production method of the present invention.

An AIP apparatus schematically shown in FIG. 1 was used in Experimental Examples 1, 2, and 4 to 6. In FIG. 1, 1 designates a chamber, 2 designates an arc evaporation source, 3 designates a support, 4 designates a bias source, 6 designates a target, 7 designates an arc source, 8 designates a means for generating a magnetic field (magnet), 11 designates a gas outlet, 12 designates a gas inlet, and W designates an object piece.

An AIP apparatus schematically shown in FIG. 5 was used in Experimental Examples 3, 7, and 8 to deposit the hard coating. The AIP apparatus of FIG. 5 is the AIP apparatus of FIG. 1 further comprising an arc evaporation source 2A, a bias power source 4A, a target 6A, an arc power source 7A, and a magnetic field generating means (magnet) 8A.

[Types of the Object Piece]

Three types of the object pieces were used in the Experimental Examples. The pieces used were: [1] a chip made of a cemented carbide (used for the determination of the crystal structure and the hardness), [2] an end mill made of a cemented carbide (diameter 10 mm; two teeth) (used for the measurement of the wear width), and [3] a disk for sliding test (made from SKD61; 55 mm (diameter)×5 mm (thickness); one side has been mirror finished; used for the measurement of the coefficient of friction).

Experimental Example 1

[Formation of Hard Coating]

The target 6 used was the one having the composition indicated in the "Compositional ratio (atomic ratio) of the target" of Table 1.

The chamber 1 was evacuated, and the object piece was heated to 500° C. by using a heater (not shown). A single or mixed gas having the composition of "Compositional ratio (atomic ratio) of the film forming gas" shown in Table 1 was supplied to the chamber 1 from the gas inlet 12 until the pressure of the chamber 1 reached 2.66 Pa. A voltage of 20 to 100 V was applied to the object piece by the bias power source 4 such that the object piece W was negative to the earth voltage. Arc discharge was then started by the arc power source 7 to vaporize and ionize the target 6 for deposition of a hard coating of 3 μm on the surface of the object piece W.

[Physical Properties of Hard Coating]

The resulting hard coatings were evaluated for their crystal structure, the value of equation (1), hardness, coefficient of friction, and wear width. The results are shown in Table 1.

TABLE 1

| | Compositional ratio (atomic ratio) of the target | | | | Compositional ratio (atomic ratio) of the film forming gas | Crystal structure | Hardness | Coefficient of friction | Wear width |
|---|---|---|---|---|---|---|---|---|---|
| | Al | V | C | N | | [The value of equation (1)] | (HV) | (μ) | (μm) |
| Comparative Example | | | | | | | | | |
| 1 | | $Ti_{0.4}Al_{0.6}N$ | | | | B[1] | 2800 | 0.67 | 55.0 |
| 2 | | $Cr_{0.4}Al_{0.6}N$ | | | | B[1] | 2750 | 0.56 | 54.0 |
| 3 | 0.00 | 1.00 | 0.00 | 1.00 | | B[1] | 2750 | 0.28 | 56.0 |
| 4 | 0.20 | 0.80 | 0.00 | 1.00 | | B[1] | 2950 | 0.29 | 54.0 |
| 5 | 0.75 | 0.25 | 0.00 | 1.00 | | B + H[0.2] | 2700 | 0.58 | 37.0 |
| 6 | 0.85 | 0.15 | 0.00 | 1.00 | | H[0] | 2200 | 0.62 | 60.0 |
| 7 | 1.00 | 0.00 | 0.00 | 1.00 | | H[0] | 2200 | 0.65 | * |
| 8 | 0.63 | 0.37 | 0.80 | 0.20 | | B[1] | 2800 | 0.28 | 56.0 |
| Example | | | | | | | | | |
| 1 | 0.25 | 0.75 | 0.00 | 1.00 | | B[1] | 3100 | 0.29 | 33.0 |
| 2 | 0.35 | 0.65 | 0.00 | 1.00 | | B[1] | 3200 | 0.29 | 35.0 |
| 3 | 0.40 | 0.60 | 0.00 | 1.00 | | B[1] | 3350 | 0.3 | 25.0 |
| 4 | 0.60 | 0.40 | 0.00 | 1.00 | | B[1] | 3400 | 0.3 | 22.0 |
| 5 | 0.63 | 0.37 | 0.00 | 1.00 | | B[1] | 3450 | 0.34 | 18.0 |
| 6 | 0.65 | 0.35 | 0.00 | 1.00 | | B[1] | 3450 | 0.35 | 18.0 |
| 7 | 0.68 | 0.32 | 0.00 | 1.00 | | B[1] | 3400 | 0.38 | 18.0 |
| 8 | 0.70 | 0.30 | 0.00 | 1.00 | | B[1] | 3000 | 0.39 | 20.0 |
| 9 | 0.73 | 0.27 | 0.00 | 1.00 | | B[1] | 3300 | 0.34 | 20.0 |

TABLE 1-continued

| | Compositional ratio (atomic ratio) of the target | | Compositional ratio (atomic ratio) of the film forming gas | | Crystal structure | Hardness | Coefficient of friction | Wear width |
|---|---|---|---|---|---|---|---|---|
| | Al | V | C | N | [The value of equation (1)] | (HV) | (μ) | (μm) |
| 10 | 0.63 | 0.37 | 0.15 | 0.85 | B[1] | 3500 | 0.31 | 19.0 |
| 11 | 0.63 | 0.37 | 0.30 | 0.70 | B[1] | 3490 | 0.3 | 23.0 |
| 12 | 0.63 | 0.37 | 0.42 | 0.58 | B[1] | 3300 | 0.3 | 25.0 |
| 13 | 0.63 | 0.37 | 0.55 | 0.45 | B[1] | 3150 | 0.29 | 29.0 |
| 14 | 0.63 | 0.37 | 0.66 | 0.34 | B[1] | 2950 | 0.29 | 46.0 |

* Became unusable at 50 m

The hard coatings of the present invention comprising Al, V, C, and N (Examples 1 to 14) all exhibited superior hardness, lower coefficient of friction, and narrower wear width compared with the conventional coatings comprising TiAlN (Comparative Example 1), CrAlN (Comparative Example 2), and VN (Comparative Example 3). The coatings outside the scope of the present invention (Comparative Examples 4 to 8) had a crystal structure containing hexagonal structure, and these coatings were inferior either in the hardness, the coefficient of friction, or the wear width compared with the conventional hard coating (Comparative Examples 1 to 3). The coatings deposited by using a film forming gas containing C (Examples 10 to 14) exhibited inferior frictional resistance and superior lubricity compared with the one prepared by using a film forming gas containing no C (Example 5).

Experimental Example 2

[Formation of Hard Coating]
The experiment was conducted by repeating the procedure of Experimental Example 1 except that target 6 used was the one having the composition of the "Compositional ratio (atomic ratio) of the target" shown in Table 2.

[Physical Properties of Hard Coating]
The resulting hard coatings were evaluated for their crystal structure, the value of equation (1), hardness, coefficient of friction, and wear width. The results are shown in Table 2.

TABLE 2

| | Compositional ratio (atomic ratio) of the target | | | | Compositional ratio (atomic ratio) of the film forming gas | | Crystal structure | Crystal grain size | Hardness | Coefficient of friction | Wear width |
|---|---|---|---|---|---|---|---|---|---|---|---|
| | Al | V | Si | B | C | N | [The value of equation (1)] | (nm) | (HV) | (μ) | (μm) |
| Comparative Example | | | | | | | | | | | |
| 1 | | | Ti$_{0.4}$Al$_{0.6}$N | | | | B[1] | 30 | 2800 | 0.67 | 55.0 |
| 2 | | | Cr$_{0.4}$Al$_{0.6}$N | | | | B[1] | 35 | 2750 | 0.56 | 54.0 |
| 9 | 0.51 | 0.25 | 0.00 | 0.24 | 0.00 | 1.00 | H[0] | 4 | 2650 | 0.21 | 43.0 |
| 10 | 0.53 | 0.20 | 0.27 | 0.00 | 0.15 | 0.85 | H[0] | 3 | 2700 | 0.4 | 53.0 |
| 11 | 0.57 | 0.20 | 0.11 | 0.12 | 0.55 | 0.45 | H[0] | 3 | 2800 | 0.35 | 55.0 |
| Example | | | | | | | | | | | |
| 15 | 0.60 | 0.40 | 0.00 | 0.00 | 0.10 | 0.90 | B[1] | 20 | 3300 | 0.3 | 22.0 |
| 16 | 0.59 | 0.40 | 0.00 | 0.01 | 1.00 | 0.00 | B[1] | 16 | 3450 | 0.28 | 18.0 |
| 17 | 0.57 | 0.40 | 0.00 | 0.03 | 0.00 | 1.00 | B[1] | 15 | 3500 | 0.28 | 18.0 |
| 18 | 0.55 | 0.40 | 0.00 | 0.05 | 0.00 | 1.00 | B[1] | 12 | 3500 | 0.26 | 17.0 |
| 19 | 0.59 | 0.34 | 0.00 | 0.07 | 0.00 | 1.00 | B[1] | 10 | 3450 | 0.25 | 17.0 |
| 20 | 0.55 | 0.30 | 0.00 | 0.15 | 0.00 | 1.00 | B + H[0.5] | 5 | 3100 | 0.23 | 20.0 |
| 21 | 0.55 | 0.25 | 0.00 | 0.20 | 0.00 | 1.00 | B + H[0.5] | 5 | 3000 | 0.22 | 24.0 |
| 22 | 0.59 | 0.40 | 0.01 | 0.00 | 0.00 | 1.00 | B[1] | 10 | 3000 | 0.3 | 23.0 |
| 23 | 0.58 | 0.40 | 0.02 | 0.00 | 0.00 | 1.00 | B[1] | 8 | 3300 | 0.32 | 22.0 |
| 24 | 0.63 | 0.35 | 0.02 | 0.00 | 0.00 | 1.00 | B[1] | 8 | 3350 | 0.31 | 21.0 |
| 25 | 0.63 | 0.32 | 0.05 | 0.00 | 0.00 | 1.00 | B[1] | 6 | 3300 | 0.33 | 22.0 |
| 26 | 0.40 | 0.30 | 0.10 | 0.00 | 0.00 | 1.00 | B[1] | 5 | 3300 | 0.32 | 22.0 |
| 27 | 0.59 | 0.30 | 0.11 | 0.00 | 0.00 | 1.00 | B[1] | 5 | 3250 | 0.33 | 25.0 |
| 28 | 0.55 | 0.30 | 0.15 | 0.00 | 0.00 | 1.00 | B[1] | 5 | 3200 | 0.33 | 26.0 |
| 29 | 0.54 | 0.28 | 0.18 | 0.00 | 0.00 | 1.00 | B + H[0.4] | 3 | 3000 | 0.35 | 34.0 |
| 30 | 0.55 | 0.25 | 0.20 | 0.00 | 0.00 | 1.00 | B + H[0.4] | 3 | 3000 | 0.36 | 36.0 |
| 31 | 0.60 | 0.35 | 0.03 | 0.02 | 0.30 | 0.70 | B[1] | 7 | 3450 | 0.29 | 19.0 |
| 32 | 0.52 | 0.40 | 0.03 | 0.05 | 0.42 | 0.58 | B[1] | 6 | 3300 | 0.31 | 23.0 |
| 33 | 0.73 | 0.15 | 0.05 | 0.07 | 0.00 | 1.00 | B + H[0.5] | 5 | 2950 | 0.4 | 39.0 |

The hard coatings of the present invention (Examples 15 to 33) all exhibited superior hardness, lower coefficient of friction, and narrower wear width compared with the conventional coatings comprising TiAlN (Comparative Example 1) and CrAlN (Comparative Example 2). The hard coating further comprising Si and B (Examples 16 to 33) exhibited equivalent or superior properties compared with the hard coating of the present invention not containing the Si or the B (Example 15). However, the coatings outside the scope of the present invention (Comparative Examples 9 to 11) contained ZnS structure in their crystal structure, and exhibited equivalent or inferior hardness and wear width compared with the conventional hard coatings (Comparative Examples 1 and 2).

Experimental Example 3

[Formation of Hard Coating]

The apparatus used was the one schematically shown in FIG. 5. The target 2 used was the one produced to have the composition indicated in the "Compositional ratio (atomic ratio) of the target" for "Layer A (upper row)" of Table 3, and the target 2A used was the having the composition indicated in the "Compositional ratio (atomic ratio) of the target" for "Layer B (lower row)" of Table 3. The coatings of Examples 39 and 41 were deposited without using the target 2.

Formation of the Hard Coatings of Examples 34 to 38 and 40

The chamber 1 was evacuated, and the object piece W was heated to 500° C. by using a heater (not shown). A single or mixed gas having the composition of "Compositional ratio (atomic ratio) of the film forming gas" shown in Table 3 was supplied to the chamber 1 from the gas inlet 12 until the pressure of the chamber 1 reached 2.66 Pa. Arc discharge was then started by the arc power source 7 to thereby vaporize and ionize the target 6, and a voltage of 20 to 100 V was applied to the object piece by the bias power source 4 such that the object piece W was negative to the earth voltage to thereby deposit layer A having the thickness indicated in Table 3 on the surface of the object piece. Arc discharge was again started this time by the arc power source 7A to vaporize and ionize the target 6A, and a voltage of 20 to 100 V was applied to the object piece W by the bias power source 4 such that the object piece W was in negative to the earth voltage to thereby deposit layer B having the thickness indicated in Table 3 on the surface of the object piece W having the layer A already deposited thereon. The procedure as described above was repeated for the number indicated in "Number of deposition" in Table 3 to produce a hard coating comprising the laminate.

Formation of the Hard Coatings of Examples 39 and 41

An object piece having the hard coating of "Layer A" of Table 3 on its surface was used, and the object piece W was heated to 500° C. by using a heater (not shown). A single or mixed gas having the composition of "Compositional ratio (atomic ratio) of the film forming gas" shown in Table 3 was supplied to the chamber 1 from the gas inlet 12 until the pressure of the chamber 1 reached 2.66 Pa. Arc discharge was again started this time by the arc power source 7A to vaporize and ionize the target 6A, and a voltage of 20 to 100 V was applied to the object piece W by the bias power source 4 such that the object piece W was in negative to the earth voltage to thereby deposit layer B having the thickness indicated in Table 3 on the surface of the object piece W.

[Evaluation of Hard Coating]

The resulting hard coatings were evaluated for their crystal structure, the value of equation (1), hardness, coefficient of friction, and wear width. The results are shown in Table 3.

TABLE 3

| | Layer A (upper row)/ Layer B (lower row) | | | | | Average compositional ratio of the targets used | | | | | Compositional ratio (atomic | |
|---|---|---|---|---|---|---|---|---|---|---|---|---|
| | Compositional ratio (atomic ratio) of the target | | | | | in the formation of layer A and layer B (atomic ratio) | | | | Total thickness | ratio) of the film forming gas | |
| | Al | V | Si | B | Thickness (nm) | Al | V | Si | B | (nm) | C | N |
| Comparative Example | | | | | | | | | | | | |
| 1 | | | | | | $Ti_{0.4}Al_{0.6}N$ | | | | | | |
| 2 | | | | | | $Cr_{0.4}Al_{0.6}N$ | | | | | | |
| Example | | | | | | | | | | | | |
| 34 | 0.00 | 1.00 | 0.00 | 0.00 | 4 | 0.40 | 0.60 | 0.00 | 0.00 | 10.0 | 0.00 | 1.00 |
| | 1.00 | 0.00 | 0.00 | 0.00 | 6 | | | | | | | |
| 35 | 0.00 | 0.96 | 0.04 | 0.00 | 3.7 | 0.63 | 0.36 | 0.01 | 0.00 | 10.0 | 0.00 | 1.00 |
| | 1.00 | 0.00 | 0.00 | 0.00 | 6.3 | | | | | | | |
| 36 | 0.00 | 1.00 | 0.00 | 0.00 | 3.8 | 0.59 | 0.38 | 0.00 | 0.03 | 10.0 | 0.05 | 0.95 |
| | 0.95 | 0.00 | 0.00 | 0.05 | 6.2 | | | | | | | |
| 37 | 0.00 | 1.00 | 0.00 | 0.00 | 30 | 0.60 | 0.40 | 0.00 | 0.00 | 75.0 | 0.00 | 1.00 |
| | 1.00 | 0.00 | 0.00 | 0.00 | 45 | | | | | | | |
| 38 | 0.69 | 0.31 | 0.00 | 0.00 | 6 | 0.582 | 0.402 | 0.012 | 0.004 | 10.0 | 0.05 | 0.95 |
| | 0.42 | 0.54 | 0.03 | 0.01 | 4 | | | | | | | |
| 39 | TiN | | | | 500 | | | | | 3000 | | |
| | 0.60 | 0.37 | 0.00 | 0.03 | 2500 | | | | | | 0.05 | 0.95 |
| 40 | $Ti_{0.4}Al_{0.6}N$ | | | | 5 | | | | | 12 | 0.03 | 0.97 |
| | 0.55 | 0.40 | 0.05 | 0.00 | 7 | | | | | | | |
| 41 | V | | | | 200 | | | | | 3000 | | |
| | 0.60 | 0.37 | 0.00 | 0.03 | 2800 | | | | | | 0.05 | 0.95 |

TABLE 3-continued

|  | Number of deposition | Crystal structure [The value of equation (1)] | Hardness (HV) | Coefficient of friction (μ) | Wear width (μm) |
|---|---|---|---|---|---|
| Comparative Example | | | | | |
| 1 | 1 | B[1] | 2800 | 0.67 | 55.0 |
| 2 | 1 | B[1] | 2750 | 0.56 | 54.0 |
| Example | | | | | |
| 34 | 300 | B[1] | 3250 | 0.25 | 20.0 |
| 35 | 300 | B[1] | 3300 | 0.31 | 21.0 |
| 36 | 300 | B[1] | 3400 | 0.21 | 20.0 |
| 37 | 40 | B[1] | 2850 | 0.5 | 48.0 |
| 38 | 300 | B[1] | 3250 | 0.24 | 35.0 |
| 39 | 1 | B[1] | 3350 | 0.28 | 20.0 |
| 40 | 250 | B[1] | 3100 | 0.32 | 29.0 |
| 41 | 1 | B[1] | 3200 | 0.29 | 25.0 |

The hard coatings of the present invention having a laminate structure (Examples 34 to 41) all exhibited superior hardness, lower coefficient of friction, and narrower wear width compared with the conventional coatings comprising TiAlN (Comparative Example 1) and CrAlN (Comparative Example 2).

Experimental Example 4

V, Al, Si, and B powders (each having a particle size of not more than 100 mesh) were mixed in V blender to the composition indicated in Table 4. The resulting powder was produced into a target under the conditions of sintering (in a reducing atmosphere and at a sintering temperature of 550° C.), HIP (10,000 atm, 480° C.), and hot casting (after heat temperature, 450° C.), respectively. The target was placed in the AIP apparatus shown in FIG. 1, and a hard coating was deposited on a surface of the object piece W. The object piece W was observed for the discharge situation, and the coating formed. The results are shown in Table 4. The film forming gas used was 100% nitrogen for Examples 42 and 43, and a mixed gas of nitrogen and methane (nitrogen:methane=80:20 (atomic ratio)) for Examples 44 and 45.

Attempt to deposit a hard coating by using the target having a relative density of less than 95% (Comparative Examples 14 and 15) failed, and the hard coating could be deposited when a target having a relative density of 95% or higher was used (Examples 42 to 45).

Experimental Example 5

[Formation of Hard Coating]

The experiment was conducted by repeating the procedure of Experimental Example 1 except that target 6 used was the one having the composition of the "Compositional ratio (atomic ratio) of the target" shown in Table 5.

[Physical Properties of Hard Coating]

The resulting hard coatings were evaluated for their crystal structure, the value of equation (1), hardness, coefficient of friction, and wear width. The results are shown in Table 5.

TABLE 4

|  | Compositional ratio (atomic ratio) of the target | | | | Production method of the target | Relative density of the target | Crystal structure [The value of equation (1)] | Hardness (HV) | Wear width (μm) |
|---|---|---|---|---|---|---|---|---|---|
|  | Al | V | Si | B | | | | | |
| Comparative Example | | | | | | | | | |
| 14 | 0.60 | 0.35 | 0.03 | 0.02 | Sintering | 88 | No film could be formed due to discharge concentration | | |
| 15 | 0.50 | 0.50 | 0.00 | 0.00 | Sintering | 92 | No film could be formed due to discharge concentration | | |
| Example | | | | | | | | | |
| 42 | 0.60 | 0.40 | 0.00 | 0.00 | HIP | 97 | B[1] | 3250 | 21.0 |
| 43 | 0.57 | 0.40 | 0.00 | 0.03 | HIP | 99 | B[1] | 3100 | 28.0 |
| 44 | 0.59 | 0.34 | 0.00 | 0.07 | Hot forging | 100 | B[1] | 3300 | 21.0 |
| 45 | 0.50 | 0.50 | 0.00 | 0.00 | Hot forging | 99 | B[1] | 3100 | 27.5 |

TABLE 5

| | Compositional ratio (atomic ratio) of the target | | | | | | Compositional ratio (atomic ratio) of the film forming gas | | Crystal structure [The value of equation (1)] | Hardness (HV) | Coefficient of friction (μ) | Wear width (μm) |
|---|---|---|---|---|---|---|---|---|---|---|---|---|
| | Al | V | Zr | Hf | Si | B | C | N | | | | |
| Comparative Example | | | | | | | | | | | | |
| 1 | | | | | | | \multicolumn{2}{c}{$Ti_{0.4}Al_{0.6}N$} | B[1] | 2800 | 0.85 | 100.0 |
| 2 | | | | | | | \multicolumn{2}{c}{$Cr_{0.4}Al_{0.6}N$} | B[1] | 2750 | 0.78 | 110.0 |
| 16 | 0.45 | 0.16 | 0.39 | 0.00 | 0.00 | 0.00 | 0.00 | 1.00 | B + H[0.4] | 2800 | 0.35 | 53.0 |
| Example | | | | | | | | | | | | |
| 46 | 0.63 | 0.37 | 0.00 | 0.00 | 0.00 | 0.00 | 0.00 | 1.00 | B[1] | 3450 | 0.55 | 65.0 |
| 47 | 0.60 | 0.37 | 0.03 | 0.00 | 0.00 | 0.00 | 0.00 | 1.00 | B[1] | 3450 | 0.5 | 50.0 |
| 48 | 0.55 | 0.37 | 0.08 | 0.00 | 0.00 | 0.00 | 0.00 | 1.00 | B[1] | 3550 | 0.45 | 45.0 |
| 49 | 0.50 | 0.35 | 0.15 | 0.00 | 0.00 | 0.00 | 0.00 | 1.00 | B[1] | 3550 | 0.4 | 41.0 |
| 50 | 0.50 | 0.27 | 0.23 | 0.00 | 0.00 | 0.00 | 0.00 | 1.00 | B[1] | 3500 | 0.39 | 46.0 |
| 51 | 0.50 | 0.35 | 0.00 | 0.15 | 0.00 | 0.00 | 0.00 | 1.00 | B[1] | 3500 | 0.41 | 39.0 |
| 52 | 0.50 | 0.35 | 0.07 | 0.08 | 0.00 | 0.00 | 0.00 | 1.00 | B[1] | 3500 | 0.39 | 39.0 |
| 53 | 0.65 | 0.20 | 0.10 | 0.05 | 0.00 | 0.00 | 0.00 | 1.00 | B[1] | 3000 | 0.4 | 45.0 |
| 54 | 0.55 | 0.40 | 0.05 | 0.00 | 0.00 | 0.00 | 0.00 | 1.00 | B[1] | 3500 | 0.45 | 43.0 |
| 55 | 0.50 | 0.40 | 0.05 | 0.05 | 0.00 | 0.00 | 0.00 | 1.00 | B[1] | 3550 | 0.45 | 41.0 |
| 56 | 0.40 | 0.30 | 0.15 | 0.15 | 0.00 | 0.00 | 0.00 | 1.00 | B[1] | 3400 | 0.46 | 47.0 |
| 57 | 0.50 | 0.35 | 0.10 | 0.00 | 0.05 | 0.00 | 0.00 | 1.00 | B[1] | 3480 | 0.4 | 36.0 |
| 58 | 0.50 | 0.31 | 0.07 | 0.07 | 0.05 | 0.00 | 0.00 | 1.00 | B[1] | 3550 | 0.4 | 41.0 |
| 59 | 0.50 | 0.31 | 0.07 | 0.07 | 0.00 | 0.05 | 0.00 | 1.00 | B[1] | 3580 | 0.38 | 42.0 |

The hard coating of Examples 47 to 59 corresponds to the results of the hard coating of the present invention containing W and/or Mo, and also shown for comparison purpose are the hard coating of the present invention containing no W or Mo (Example 46) and the conventional hard coatings (Comparative Examples 1 and 2). Under the sliding conditions at 800° C, the hard coatings containing the Mo and/or the W (Examples 47 to 59) were superior in all of the hardness, the coefficient of friction, and the wear width compared with the conventional hard coatings. In particular, in the case of a hard coating containing the V at content of 0.27 or higher (Examples 47 to 52 and 54 to 56), all of the hardness, the coefficient of friction, and the wear width could be improved by incorporating the W and/or the Mo in the hard coating compared with the hard coating of Example 46. However, when the total content of the W and the Mo is 0.39 or higher, decrease in the hardness and increase in the wear width was found due to emergence of hexagonal structure-type crystal structure. (Comparative Example 16).

Experimental Example 6

[Formation of Hard Coating]
The experiment was conducted by repeating the procedure of Experimental Example 1 except that target 6 used was the one having the composition of the "Compositional ratio (atomic ratio) of the target" shown in Table 6.

[Physical Properties of Hard Coating]
The resulting hard coatings were evaluated for their crystal structure, the value of equation (1), hardness, coefficient of friction, and wear width. The results are shown in Table 6.

TABLE 6

| | Compositional ratio (atomic ratio) of the target | | | | | | Compositional ratio (atomic ratio) of the film forming gas | | Crystal structure [The value of equation (1)] | Hardness (HV) | Coefficient of friction (μ) | Wear width (μm) |
|---|---|---|---|---|---|---|---|---|---|---|---|---|
| | Al | V | Zr | Hf | Si | B | C | N | | | | |
| Comparative Example | | | | | | | | | | | | |
| 1 | | | | | | | \multicolumn{2}{c}{$Ti_{0.4}Al_{0.6}N$} | B[1] | 2800 | 0.85 | 100.0 |
| 2 | | | | | | | \multicolumn{2}{c}{$Cr_{0.4}Al_{0.6}N$} | B[1] | 2750 | 0.78 | 110.0 |
| Example | | | | | | | | | | | | |
| 46 | 0.63 | 0.37 | 0.00 | 0.00 | 0.00 | 0.00 | 0.00 | 1.00 | B[1] | 3450 | 0.55 | 65.0 |
| 60 | 0.60 | 0.37 | 0.03 | 0.00 | 0.00 | 0.00 | 0.00 | 1.00 | B[1] | 3450 | 0.53 | 50.0 |
| 61 | 0.55 | 0.37 | 0.08 | 0.00 | 0.00 | 0.00 | 0.00 | 1.00 | B[1] | 3500 | 0.51 | 47.0 |
| 62 | 0.50 | 0.35 | 0.15 | 0.00 | 0.00 | 0.00 | 0.00 | 1.00 | B[1] | 3560 | 0.53 | 39.0 |
| 63 | 0.50 | 0.27 | 0.23 | 0.00 | 0.00 | 0.00 | 0.00 | 1.00 | B[1] | 3500 | 0.55 | 47.0 |
| 64 | 0.50 | 0.05 | 0.45 | 0.00 | 0.00 | 0.00 | 0.00 | 1.00 | B + H[0.35] | 3100 | 0.56 | 51.0 |
| 65 | 0.50 | 0.05 | 0.00 | 0.45 | 0.00 | 0.00 | 0.00 | 1.00 | B + H[0.30] | 3050 | 0.57 | 53.0 |

TABLE 6-continued

| | Compositional ratio (atomic ratio) of the target | | | | | | Compositional ratio (atomic ratio) of the film forming gas | | Crystal structure [The value of equation (1)] | Hardness (HV) | Coefficient of friction (μ) | Wear width (μm) |
|---|---|---|---|---|---|---|---|---|---|---|---|---|
| | Al | V | Zr | Hf | Si | B | C | N | | | | |
| 66 | 0.50 | 0.35 | 0.00 | 0.15 | 0.00 | 0.00 | 0.00 | 1.00 | B[1] | 3550 | 0.54 | 38.0 |
| 67 | 0.50 | 0.35 | 0.07 | 0.08 | 0.00 | 0.00 | 0.00 | 1.00 | B[1] | 3520 | 0.54 | 38.0 |
| 68 | 0.35 | 0.25 | 0.40 | 0.00 | 0.00 | 0.00 | 0.00 | 1.00 | B[1] | 3400 | 0.52 | 48.0 |
| 69 | 0.35 | 0.25 | 0.00 | 0.40 | 0.00 | 0.00 | 0.00 | 1.00 | B[1] | 3450 | 0.52 | 47.0 |
| 70 | 0.35 | 0.25 | 0.25 | 0.15 | 0.00 | 0.00 | 0.00 | 1.00 | B[1] | 3450 | 0.5 | 48.0 |
| 70 | 0.50 | 0.40 | 0.10 | 0.00 | 0.00 | 0.00 | 0.00 | 1.00 | B[1] | 3500 | 0.53 | 45.0 |
| 72 | 0.50 | 0.30 | 0.20 | 0.00 | 0.00 | 0.00 | 0.00 | 1.00 | B[1] | 3550 | 0.52 | 40.0 |
| 73 | 0.50 | 0.35 | 0.10 | 0.00 | 0.05 | 0.00 | 0.00 | 1.00 | B[1] | 3480 | 0.55 | 37.0 |
| 74 | 0.50 | 0.31 | 0.07 | 0.07 | 0.05 | 0.00 | 0.00 | 1.00 | B[1] | 3570 | 0.52 | 39.0 |
| 75 | 0.50 | 0.31 | 0.07 | 0.07 | 0.00 | 0.05 | 0.00 | 1.00 | B[1] | 3580 | 0.48 | 41.0 |

The hard coating of Examples 60 to 75 corresponds to the results of the hard coating of the present invention containing Zr and/or Hf, and also shown for comparison purpose are the hard coating of the present invention containing no Zr or Hf (Example 46) and the conventional hard coatings (Comparative Examples 1 and 2). Under the sliding conditions at 800° C., the hard coatings of Examples 60 to 75 were superior in all of the hardness, the coefficient of friction, and the wear width compared with the conventional hard coatings. In the case of the hard coatings of Examples 60 to 75, increase in the hardness and decrease in the wear width over those of the hard coating of Example 46 could be realized with no significant change in the coefficient of friction by incorporating the Zr or the Hf. However, when the total content of such elements (Zr and Hf) was 0.45 or higher, decrease in the hardness and increase in the wear width started to take place due to emergence of hexagonal structure-type crystal structure (Examples 64 and 65). While the hardness and the wear width will not be inferior to the conventional hard coatings (Comparative Examples 1 and 2) when such decrease is like those of Examples 64 and 65, further increase in the total content of the Zr and the Hf will invite a significant decrease in the hardness as well as a significant increase in the wear width.

Experimental Example 7

[Formation of Hard Coating]

The apparatus used was the one schematically shown in FIG. 5. In Examples 77 to 87, the target 2 used was the one produced to have the composition indicated in the "Compositional ratio (atomic ratio) of the target" for "Layer A (upper row)" of Table 7, and the target 2A used was the one produced to have the composition indicated in the "Compositional ratio (atomic ratio) of the target" for "Layer B (lower row)" of Table 7, and the hard coating was deposited by using these targets. The coating of Example 76 was deposited without using the target 2. Except for these, the procedure of Experimental Example 3 was repeated.

[Evaluation of Hard Coating]

The resulting hard coatings were evaluated for their hardness, coefficient of friction, and wear width. The results are shown in Table 7.

TABLE 7

| | Layer A (upper row)/Layer B (lower row) | | | | | | | | Film | | | | | |
| | Compositional ratio (atomic ratio) of the target | | | | | | Thickness (nm) | Total thickness (nm) | forming gas | | Number of deposition | Hardness (HV) | Coefficient of friction (μ) | Wear width (μm) |
| | Al | V | Zr | Hf | Si | B | | | C | N | | | | |
| Comparative Example | | | | | | | | | | | | | | |
| 1 | | | $Ti_{0.4}Al_{0.6}N$ | | | | 3000 | 3000 | 0.0 | 1.0 | 1 | 2800 | 0.85 | 100.0 |
| 2 | | | $Cr_{0.4}Al_{0.6}N$ | | | | 3000 | 3000 | 0.0 | 1.0 | 1 | 2750 | 0.78 | 110.0 |
| Example | | | | | | | | | | | | | | |
| 46 | 0.65 | 0.35 | 0.00 | 0.00 | 0.00 | 0.00 | 3000 | 3000 | 0.0 | 1.0 | 1 | 3450 | 0.55 | 65.0 |
| 76 | 0.63 | 0.32 | 0.00 | 0.00 | 0.05 | 0.00 | 3000 | 3000 | 0.0 | 1.0 | 1 | 3300 | 0.57 | 55.0 |
| 77 | 0.65 | 0.35 | 0.00 | 0.00 | 0.00 | 0.00 | 20 | 3000 | 0.0 | 1.0 | 143 | 3450 | 0.55 | 45.0 |
| | 0.00 | 0.00 | 1.00 | 0.00 | 0.00 | 0.00 | 1 | | | | | | | |
| 78 | 0.65 | 0.35 | 0.00 | 0.00 | 0.00 | 0.00 | 20 | 3000 | 0.0 | 1.0 | 130 | 3500 | 0.51 | 34.0 |
| | 0.00 | 0.00 | 1.00 | 0.00 | 0.00 | 0.00 | 3 | | | | | | | |
| 79 | 0.65 | 0.35 | 0.00 | 0.00 | 0.00 | 0.00 | 20 | 3000 | 0.0 | 1.0 | 103 | 3550 | 0.46 | 40.0 |
| | 0.00 | 0.00 | 1.00 | 0.00 | 0.00 | 0.00 | 9 | | | | | | | |
| 80 | 0.65 | 0.35 | 0.00 | 0.00 | 0.00 | 0.00 | 20 | 3000 | 0.0 | 1.0 | 86 | 3500 | 0.43 | 41.0 |
| | 0.00 | 0.00 | 1.00 | 0.00 | 0.00 | 0.00 | 15 | | | | | | | |
| 81 | 0.65 | 0.35 | 0.00 | 0.00 | 0.00 | 0.00 | 20 | 3000 | 0.0 | 1.0 | 55 | 3400 | 0.4 | 53.0 |
| | 0.00 | 0.00 | 1.00 | 0.00 | 0.00 | 0.00 | 35 | | | | | | | |

TABLE 7-continued

| | Layer A (upper row)/Layer B (lower row) | | | | | | | Film | | | | | |
| | Compositional ratio (atomic ratio) of the target | | | | | | Thickness | Total thickness | forming gas | | Number of deposition | Hardness | Coefficient of friction | Wear width |
| | Al | V | Zr | Hf | Si | B | (nm) | (nm) | C | N | | (HV) | (μ) | (μm) |
|---|---|---|---|---|---|---|---|---|---|---|---|---|---|---|
| 82 | 0.65 | 0.35 | 0.00 | 0.00 | 0.00 | 0.00 | 20 | 3000 | 0.5 | 0.5 | 136 | 3500 | 0.41 | 34.0 |
|  | 0.00 | 0.00 | 1.00 | 0.00 | 0.00 | 0.00 | 2 | | | | | | | |
| 83 | 0.60 | 0.35 | 0.00 | 0.00 | 0.00 | 0.05 | 20 | 3000 | 0.0 | 1.0 | 136 | 3550 | 0.4 | 41.0 |
|  | 0.00 | 0.00 | 1.00 | 0.00 | 0.00 | 0.00 | 2 | | | | | | | |
| 84 | 0.63 | 0.32 | 0.00 | 0.00 | 0.05 | 0.00 | 55 | 3000 | 0.0 | 1.0 | 50 | 3550 | 0.43 | 40.0 |
|  | 0.00 | 0.00 | 0.00 | 1.00 | 0.00 | 0.00 | 5 | | | | | | | |
| 85 | 0.63 | 0.32 | 0.00 | 0.00 | 0.05 | 0.00 | 80 | 3000 | 0.0 | 1.0 | 35 | 3500 | 0.43 | 42.0 |
|  | 0.00 | 0.00 | 0.00 | 1.00 | 0.00 | 0.00 | 5 | | | | | | | |
| 86 | 0.63 | 0.32 | 0.00 | 0.00 | 0.05 | 0.00 | 150 | 3000 | 0.0 | 1.0 | 19 | 3450 | 0.53 | 53.0 |
|  | 0.00 | 0.00 | 0.00 | 1.00 | 0.00 | 0.00 | 10 | | | | | | | |
| 87 | 0.63 | 0.32 | 0.00 | 0.00 | 0.05 | 0.00 | 30 | 3000 | 0.0 | 1.0 | 94 | 3550 | 0.43 | 42.0 |
|  | 0.00 | 0.00 | 0.50 | 0.50 | 0.00 | 0.00 | 2 | | | | | | | |

The laminate hard coatings of the present invention (Examples 77 to 87) all exhibited superior hardness, lower coefficient of friction, and narrower wear width compared with the conventional hard coatings (Comparative Examples 1 and 2). Decrease in the coefficient of friction and the wear width over those of the single layer hard coating (Example 46) could also be realized by depositing a laminate hard coating (Experimental Examples 77 to 83). The results of the single layer hard coating of Example 76 and the laminate hard coatings of Examples 84 to 87 also indicate that the embodiment of the present invention is fully effective for the hard coating containing Si.

Experimental Example 8

[Formation of Hard Coating]

The apparatus used was the one schematically shown in FIG. 5. In Examples 88 to 98, the target 2 used was the one produced to have the composition indicated in the "Compositional ratio (atomic ratio) of the target" for "Layer A (upper row)" of Table 7, and the target 2A used was the one produced to have the composition indicated in the "Compositional ratio (atomic ratio) of the target" for "Layer B (lower row)" of Table 7, and the hard coating was deposited by using these targets. Except for these, the procedure of Experimental Example 3 was repeated.

[Evaluation of Hard Coating]

The resulting hard coatings were evaluated for their hardness, coefficient of friction, and wear width. The results are shown in Table 8.

TABLE 8

| | Layer A (upper row)/Layer B (lower row) | | | | | | | Film | | | | | |
| | Compositional ratio (atomic ratio) of the target | | | | | | Thickness | Total thickness | forming gas | | Number of deposition | Hardness | Coefficient of friction | Wear width |
| | Al | V | Zr | Hf | Si | B | (nm) | (nm) | C | N | | (HV) | (μ) | (μm) |
|---|---|---|---|---|---|---|---|---|---|---|---|---|---|---|
| Comparative Example | | | | | | | | | | | | | | |
| 1 | | | $Ti_{0.4}Al_{0.6}N$ | | | | 3000 | 3000 | 0.0 | 1.0 | 1 | 2800 | 0.85 | 100.0 |
| 2 | | | $Cr_{0.4}Al_{0.6}N$ | | | | 3000 | 3000 | 0.0 | 1.0 | 1 | 2750 | 0.78 | 110.0 |
| Example | | | | | | | | | | | | | | |
| 46 | 0.65 | 0.35 | 0.00 | 0.00 | 0.00 | 0.00 | 3000 | 3000 | 0.0 | 1.0 | 1 | 3450 | 0.55 | 65.0 |
| 76 | 0.63 | 0.32 | 0.00 | 0.00 | 0.05 | 0.00 | 3000 | 3000 | 0.0 | 1.0 | 1 | 3300 | 0.57 | 55.0 |
| 88 | 0.65 | 0.35 | 0.00 | 0.00 | 0.00 | 0.00 | 20 | 3000 | 0.0 | 1.0 | 143 | 3300 | 0.55 | 50.0 |
|  | 0.00 | 0.00 | 1.00 | 0.00 | 0.00 | 0.00 | 1 | | | | | | | |
| 89 | 0.65 | 0.35 | 0.00 | 0.00 | 0.00 | 0.00 | 20 | 3000 | 0.0 | 1.0 | 130 | 3500 | 0.55 | 44.0 |
|  | 0.00 | 0.00 | 1.00 | 0.00 | 0.00 | 0.00 | 3 | | | | | | | |
| 90 | 0.65 | 0.35 | 0.00 | 0.00 | 0.00 | 0.00 | 20 | 3000 | 0.0 | 1.0 | 103 | 3600 | 0.54 | 40.0 |
|  | 0.00 | 0.00 | 1.00 | 0.00 | 0.00 | 0.00 | 9 | | | | | | | |
| 91 | 0.65 | 0.35 | 0.00 | 0.00 | 0.00 | 0.00 | 20 | 3000 | 0.0 | 1.0 | 86 | 3550 | 0.56 | 35.0 |
|  | 0.00 | 0.00 | 1.00 | 0.00 | 0.00 | 0.00 | 15 | | | | | | | |
| 92 | 0.65 | 0.35 | 0.00 | 0.00 | 0.00 | 0.00 | 20 | 3000 | 0.0 | 1.0 | 55 | 3500 | 0.55 | 45.0 |
|  | 0.00 | 0.00 | 1.00 | 0.00 | 0.00 | 0.00 | 35 | | | | | | | |
| 93 | 0.65 | 0.35 | 0.00 | 0.00 | 0.00 | 0.00 | 20 | 3000 | 0.5 | 0.5 | 136 | 3500 | 0.54 | 34.0 |
|  | 0.00 | 0.00 | 1.00 | 0.00 | 0.00 | 0.00 | 2 | | | | | | | |
| 94 | 0.60 | 0.35 | 0.00 | 0.00 | 0.00 | 0.05 | 20 | 3000 | 0.0 | 1.0 | 136 | 3600 | 0.56 | 41.0 |
|  | 0.00 | 0.00 | 0.00 | 1.00 | 0.00 | 0.00 | 2 | | | | | | | |
| 95 | 0.63 | 0.32 | 0.00 | 0.00 | 0.05 | 0.00 | 55 | 3000 | 0.0 | 1.0 | 50 | 3450 | 0.5 | 40.0 |
|  | 0.00 | 0.00 | 0.00 | 1.00 | 0.00 | 0.00 | 5 | | | | | | | |

TABLE 8-continued

| | Layer A (upper row)/Layer B (lower row) | | | | | | | Film | | | | | |
|---|---|---|---|---|---|---|---|---|---|---|---|---|---|
| | Compositional ratio (atomic ratio) of the target | | | | | | Thickness | Total thickness | forming gas | | Number of deposition | Hardness (HV) | Coefficient of friction (μ) | Wear width (μm) |
| | Al | V | Zr | Hf | Si | B | (nm) | (nm) | C | N | | | | |
| 96 | 0.63 | 0.32 | 0.00 | 0.00 | 0.05 | 0.00 | 80 | 3000 | 0.0 | 1.0 | 35 | 3500 | 0.53 | 47.0 |
| | 0.00 | 0.00 | 0.00 | 1.00 | 0.00 | 0.00 | 5 | | | | | | | |
| 97 | 0.63 | 0.32 | 0.00 | 0.00 | 0.05 | 0.00 | 150 | 3000 | 0.0 | 1.0 | 19 | 3600 | 0.56 | 55.0 |
| | 0.00 | 0.00 | 0.00 | 1.00 | 0.00 | 0.00 | 10 | | | | | | | |
| 98 | 0.63 | 0.32 | 0.00 | 0.00 | 0.05 | 0.00 | 30 | 3000 | 0.0 | 1.0 | 94 | 3550 | 0.53 | 42.0 |
| | 0.00 | 0.00 | 0.50 | 0.50 | 0.00 | 0.00 | 2 | | | | | | | |

The laminate hard coatings of the present invention (Examples 88 to 98) all exhibited superior hardness, lower coefficient of friction, and narrower wear width compared with the conventional hard coatings (Comparative Examples 1 and 2). In the case of laminate hard coatings (Experimental Examples 87 to 93), increase in the hardness and decrease in the wear width could be realized with the coefficient of friction substantially maintained at the same level as the single layer hard coating (Example 46). The embodiment of the present invention is also fully effective for the hard coating containing Si (Examples 95 to 98).

The hard coating of the present invention has extremely superb hardness and lubricity, and therefore, it can be used in cutting tools (chip, drill, end mill, etc.) and jig and tools (forging dye, blanking punch, etc.), and also, in various automobile sliding members.

The foregoing invention has been described in terms of preferred embodiments. However, those skilled in the art will recognize that many variations of such embodiments exist. Such variations are intended to be within the scope of the present invention and the appended claims.

What is claimed is:

1. A multilayer hard coating comprising at least two layers and having a periodicity of not more than 80 nm, wherein
each of the at least two layers independently comprises
a nitride of at least one element selected from Al, V, Si and B, or
a carbonitride of at least one element selected from Al, V, Si and B; and
the multilayer hard coating has an average composition satisfying either a composition (X) or a composition (Y), where
the composition (X) is $(Al_{1-a}V_a)(C_{1-x}N_x)$, where $0.27 \leq a \leq 0.75$, $0.3 \leq X \leq 1$, and a and X independently represent an atomic ratio; and
the composition (Y) is $(Al_{1-a-b-c}V_aSi_bB_c)(C_{1-x}N_x)$, where $0.1 \leq a \leq 0.75$, $0 < b+c \leq 0.20$, $0.3 \leq X \leq 1$, and a, b, c and X independently represent an atomic ratio with the proviso that b and c are not simultaneously 0 while one of b and c may be 0.

2. A multilayer hard coating comprising at least four layers and having a periodicity of not more than 80 nm, wherein
the at least four layers comprise
at least two layers independently comprising a nitride of TiAl, a carbonitride of TiAl, a nitride of CrAl or a carbonitride of CrAl; and
at least two layers having an average composition satisfying either a composition (X) or a composition (Y), where
the composition (X) is $(Al_{1-a}V_a)(C_{1-x}N_x)$, where $0.27 \leq a \leq 0.75$, $0.3 \leq X \leq 1$, and a and X independently represent an atomic ratio; and
the composition (Y) is $(Al_{1-a-b-c}V_aSi_bB_c)(C_{1-x}N_x)$, where $0.1 \leq a \leq 0.75$, $0 < b+c \leq 0.20$, $0.3 \leq X \leq 1$, and a, b, c and X independently represent an atomic ratio with the proviso that b and c are not simultaneously 0 while one of b and c may be 0.

3. The multilayer hard coating according to claim 1, wherein the multilayer hard coating has a NaCl-type crystal structure.

4. The multilayer hard coating according to claim 2, wherein the multilayer hard coating has a NaCl-type crystal structure.

5. A laminate hard coating comprising at least two of the multilayer hard coating of claim 1, wherein adjacent multilayer hard coatings have different compositions.

6. A laminate hard coating comprising at least two of the multilayer hard coating of claim 2, wherein adjacent multilayer hard coatings have different compositions.

7. A composite hard coating comprising the multilayer hard coating of claim 1, wherein on at least one surface of the multilayer hard coating is deposited another hard coating having a NaCl-type crystal structure, having a different composition than the multilayer hard coating, and comprising a metal nitride, a metal carbonate or a metal carbonitride; or
a layer comprising at least one metal selected from the group consisting of Al, Si, elements of Groups 4A, 5A and 6A of the Periodic Table, and alloys thereof.

8. A composite hard coating comprising the multilayer hard coating of claim 2, wherein on at least one surface of the multilayer hard coating is deposited another hard coating having a NaCl-type crystal structure, having a different composition than the multilayer hard coating, and comprising a metal nitride, a metal carbonate or a metal carbonitride; or a layer comprising at least one metal selected from the group consisting of Al, Si, elements of Groups 4A, 5A and 6A of the Periodic Table, and alloys thereof.

9. A laminate hard coating comprising
a layer A comprising a hard coating having either a composition (X) or a composition (Y); and
a layer B comprising a compound containing
at least one of Mo and W, and
at least one of C and N, wherein
the composition (X) is $(Al_{1-a}V_a)(C_{1-x}N_x)$, where $0.27 \leq a \leq 0.75$, $0.3 \leq X \leq 1$, and a and X independently represent an atomic ratio; and
the composition (Y) is $(Al_{1-a-b-c}V_aSi_bB_c)(C_{1-x}N_x)$, where $0.1 \leq a \leq 0.75$, $0 < b+c \leq 0.20$, $0.3 \leq X \leq 1$, and a, b, c, and X independently represent an atomic ratio with the proviso that b and c are not simultaneously 0 while one of b and c may be 0.

10. The hard coating according to claim 9, wherein a thickness of the layer B≦a thickness of the layer A≦200 nm.

11. A laminate hard coating comprising
a layer A comprising a hard coating having either a composition (X) or a composition (Y); and
a layer C comprising a compound comprising
at least one of Zr and Hf, and
at least one of C and N, wherein
the composition (X) is $(Al_{1-a}V_a)(C_{1-x}N_x)$, where $0.27 \leq a \leq 0.75$, $0.3 \leq X \leq 1$, and a and X independently represent an atomic ratio; and
the composition (Y) is $(Al_{1-a-b-c}V_aSi_bB_c)(C_{1-x}N_x)$, where $0.1 \leq a \leq 0.75$, $0 < b+c \leq 0.20$, $0.3 \leq X \leq 1$, and a, b, c, and X independently represent an atomic ratio with the proviso that b and c are not simultaneously 0 while one of b and c may be 0.

12. The hard coating according to claim 11, wherein a thickness of the layer C≦a thickness of the layer A≦200 nm.

13. A method for depositing a hard coating, the method comprising
evaporating a metal in a film-forming gas atmosphere for ionization and promoting plasmatization of the film-forming gas together with ionization of the metal; and
depositing the hard coating of claim 1.

14. The method according to claim 13, wherein
the hard coating is deposited on an object piece;
the metal is in a target; and
the method comprises arc ion plating in which
the metal in the target is evaporated and ionized by arc discharge,
parallel or divergent lines of magnetic force that extend in a direction substantially perpendicular to an evaporation surface of the target are formed, and
plasmatization of the film-forming gas is promoted near the object piece by the lines of magnetic force.

15. The method according to claim 13, wherein a magnetic flux density at a surface of the object piece is not less than 10 gauss.

16. The method according to claim 13, wherein
the hard coating is deposited on an object piece;
the metal is in a target; and
a magnetic field is formed between the target and the object piece such that an angle formed between a line of magnetic force and a normal line of an evaporation surface of the target is not more than ±30°.

* * * * *